(12) United States Patent
Choi et al.

(10) Patent No.: US 12,108,639 B2
(45) Date of Patent: Oct. 1, 2024

(54) LIGHT EMITTING DISPLAY APPARATUS

(71) Applicant: LG Display Co., Ltd., Seoul (KR)

(72) Inventors: Yonghoon Choi, Paju-si (KR); KeumKyu Min, Paju-si (KR); Mingeun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 516 days.

(21) Appl. No.: 17/410,372

(22) Filed: Aug. 24, 2021

(65) Prior Publication Data

US 2022/0069053 A1   Mar. 3, 2022

(30) Foreign Application Priority Data

Sep. 2, 2020 (KR) .......................... 10-2020-0111580

(51) Int. Cl.
*H10K 59/13* (2023.01)
*H10K 50/842* (2023.01)
*H10K 59/121* (2023.01)
*H10K 59/131* (2023.01)

(52) U.S. Cl.
CPC ....... *H10K 59/131* (2023.02); *H10K 50/8426* (2023.02); *H10K 59/121* (2023.02)

(58) Field of Classification Search
CPC ............ H10K 59/131; H10K 50/8426; H10K 59/121; H10K 50/86; H10K 50/813; H10K 50/822; H10K 50/85; H10K 50/854; H10K 59/124; H10K 59/12; H10K 59/877; H10K 59/38
See application file for complete search history.

(56) References Cited

U.S. PATENT DOCUMENTS

| 2003/0094615 | A1 | 5/2003 | Yamazaki et al. |
| 2004/0212759 | A1 | 10/2004 | Hayashi |
| 2008/0116791 | A1 | 5/2008 | Kim |
| 2014/0346449 | A1* | 11/2014 | Choi ............... H10K 50/854 438/23 |
| 2017/0125738 | A1* | 5/2017 | Kim ............... H10K 50/822 |
| 2018/0254431 | A1* | 9/2018 | Kim ............... H10K 59/8731 |
| 2019/0006626 | A1* | 1/2019 | Kim ............... H10K 50/86 |

(Continued)

FOREIGN PATENT DOCUMENTS

| CN | 113206136 A | 8/2021 |
| KR | 10-2005-0000131 A | 1/2005 |
| KR | 10-2014-0080235 A | 6/2014 |

OTHER PUBLICATIONS

Combined Search and Examination Report issued by the United Kingdom Patent Office in corresponding United Kingdom Application No. GB2112419.3, dated Feb. 21, 2022.

(Continued)

*Primary Examiner* — S M Sohel Imtiaz
(74) *Attorney, Agent, or Firm* — Morgan, Lewis & Bockius LLP

(57) ABSTRACT

A light emitting display apparatus includes a substrate configured to include a display area with a plurality of pixel areas, and a non-display area surrounding the display area, and a planarization layer disposed at the display area and partially at the non-display area. The planarization layer is configured to include an uneven pattern portion disposed at the non-display area, and the uneven pattern portion is configured to include a plurality of concave portions.

25 Claims, 9 Drawing Sheets

(56) References Cited

U.S. PATENT DOCUMENTS

2019/0131375 A1* 5/2019 Kim .................... H10K 59/124
2019/0372056 A1 12/2019 Lee et al.
2021/0359252 A1* 11/2021 Wang ................... H10K 50/844

OTHER PUBLICATIONS

Office Action issued Dec. 13, 2023 for German Patent Application No. 10 2021 122 357.1 Note: US 2017/0125738 A1.

* cited by examiner

L2 < L4 < L3 < L1

LIGHT EMITTING DISPLAY APPARATUS

CROSS-REFERENCE TO RELATED APPLICATIONS

This application claims the benefit of and priority to Korean Patent Application No. 10-2020-0111580 filed on Sep. 2, 2020, the entirety of which is hereby incorporated by reference.

BACKGROUND

Technical Field

The present disclosure relates to a light emitting display apparatus.

Discussion of the Related Art

A light emitting display apparatus is a self-emitting display apparatus, and unlike a liquid crystal display apparatus, the light emitting display apparatus may be fabricated at a lightweight and slim size as it does not need an additional light source. Also, the light emitting display apparatus is favorable in view of power consumption due to low voltage driving and also is excellent for a color realization, a response speed, a viewing angle, and a contrast ratio, whereby the light emitting display apparatus has been studied as a display for next generation.

The light emitting display apparatus displays an image by a light emission of a light emitting portion including a light emitting device layer interposed between two electrodes.

The light emitting display apparatus includes a display panel including a display area having a plurality of pixels to display an image and a non-display area surrounding the display area. The light emitting display apparatus further includes a black edge pattern provided along the edge of a screen (or front surface) of the display panel to prevent external light from being reflected by a metal layer disposed at the non-display area.

The light emitting display apparatus has a problem related with a color difference (or a difference in an impression of color) between the display area and the black edge pattern disposed at the edge of the display panel. For example, when the light emitting display apparatus is turned-off (or is not driven), the screen edge of the display panel is shown as a black color due to the black edge pattern according to a reflection of external light, and the display area is shown as a non-black color by a reflection of external light, whereby there might be a difference in impression of a color between the display area and the edge of the display panel.

SUMMARY

The inventors of the present disclosure have recognized the above-mentioned problems, and have performed various experiments for reducing or minimizing a color difference (or a difference in an impression of color) between a display area and an edge of a display panel. Through the various experiments, the inventors have invented a light emitting display apparatus having a new structure capable of preventing or minimizing a color difference (or a difference in an impression of color) between a display area and a non-display area of a display panel.

Accordingly, embodiments of the present disclosure are directed to a light emitting display apparatus that substantially obviates one or more problems due to limitations and disadvantages of the related art.

An aspect of the present disclosure is to provide a light emitting display apparatus which minimizes or prevents a color difference (or a difference in an impression of color) between a display area and a non-display area of a display panel.

An aspect of the present disclosure is to provide a light emitting display apparatus capable of minimizing or preventing a color difference (or a difference in an impression of color) between a display area and a non-display area of a display panel by the increase of a light extraction efficiency in a pixel.

To achieve these and other aspects of the inventive concepts, as embodied and broadly described herein, a light emitting display apparatus comprises a substrate configured to include a display area with a plurality of pixel areas, and a non-display area surrounding the display area and including a pad area, and a planarization layer disposed at the display area and partially at the non-display area, the planarization layer is configured to include an uneven pattern portion disposed at the non-display area, and the uneven pattern portion is configured to include a plurality of concave portions. The uneven pattern portion may include a plurality of concave portions and a protruding portion disposed between the plurality of concave portions. The uneven pattern portion may include an undulated pattern. The non-display area may include a pad area. The planarization layer may be disposed at the remaining non-display area except the pad area among the non-display area. The planarization layer may only partially be disposed at the non-display area. In other words, the planarization layer may not be fully disposed at the non-display area. A portion of the non-display area may not overlap with the planarization layer. The non-display area may include a pad area and the planarization layer may not be disposed at the pad area.

In another aspect, a light emitting display apparatus comprises a substrate configured to include a display area having a plurality of pixel areas and a non-display area surrounding the display area, a pixel circuit portion at the display area of the substrate, a peripheral circuit portion at the non-display area of the substrate, a planarization layer at the pixel circuit portion and the peripheral circuit portion, and a light emitting portion over the planarization layer of each of the plurality of pixel areas, the planarization layer at the peripheral circuit portion includes an uneven pattern portion, and the uneven pattern portion is configured to include a plurality of concave portions.

In another aspect, a light emitting display apparatus comprises a substrate configured to include a display area with a plurality of pixel areas, and a non-display area surrounding the display area; and a planarization layer disposed at the display area and partially at the non-display area, the planarization layer includes a plurality of concave portions. The non-display area may include a pad area. The planarization layer may be disposed at the remaining non-display area except the pad area among the non-display area. The planarization layer may be only partially disposed at the non-display area, and/or the planarization layer may be not disposed at the pad area. The planarization layer may include protruding portions disposed between the plurality of concave portions disposed at a surface. The planarization layer may have an undulated shape.

According to the embodiments of the present disclosure, a color difference between the display area and the non-display area of the display panel may be minimized or prevented.

Also, according to the embodiments of the present disclosure, a light extraction efficiency of the pixel may be improved and also the color difference between the display area and the non-display area of the display panel may be minimized or prevented.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
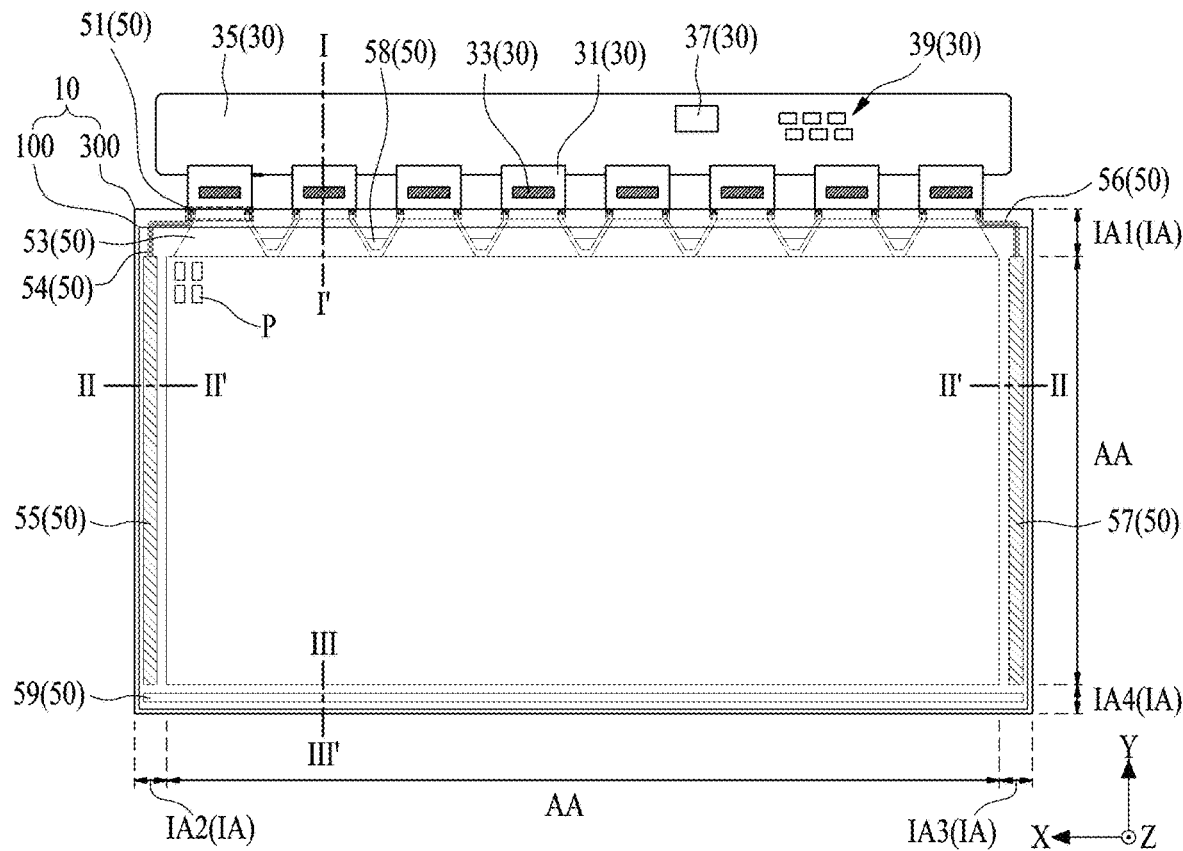
FIG. 1 illustrates a light emitting display apparatus according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as "on," "over," "under," and "next," one or more other parts may be disposed between the two parts unless a more limiting term, such as "just" or "direct(ly)" is used.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an embodiment of the present disclosure will be described in detail with reference to the accompanying drawings. Since a scale of each of elements shown in the accompanying drawings is different from an actual scale for convenience of description, an embodiment of the present disclosure is not limited to the shown scale. Wherever possible, the same reference numbers will be used throughout the drawings to refer to the same or like parts.

FIG. 1 illustrates a light emitting display apparatus according to an embodiment of the present disclosure.

With reference to FIG. 1, a light emitting display apparatus according to an embodiment of the present disclosure may include a display panel 10 and a panel driving circuit part 30.

The display panel 10 may include a substrate 100 and an opposite substrate 300 bonded to each other.

The substrate 100 includes a thin film transistor, and the substrate 100 may be a transistor array substrate, a lower substrate, a base substrate, or a first substrate. The substrate 100 may be a transparent glass substrate or a transparent plastic substrate. For example, the substrate 100 may be a transparent glass substrate.

The substrate 100 according to an embodiment of the present disclosure may include a display area AA and a non-display area IA.

The display area AA is an area for displaying an image. The display area AA may be a pixel array area, an active area, a display area, or a screen. For example, the display area AA may be disposed at a central area of the display panel 10.

The display area AA according to an embodiment of the present disclosure may include gate lines, data lines, pixel driving power lines, and a plurality of pixels P. Each of the plurality of pixels P may be disposed at each pixel area defined by the gate lines and the data lines.

Each of the plurality of pixels P may be defined as a minimum unit area in which light is actually emitted.

According to an embodiment of the present disclosure, among the plurality of pixels P, the three pixels which are disposed adjacently or disposed along a length direction of the gate line (or data line) constitute a unit pixel. A unit pixel may include at least one red pixel, at least one green pixel, and at least one blue pixel, but embodiments of the present disclosure are not limited thereto. For example, each of the at least one red pixel, at least one green pixel, and at least one blue pixel may each be a sub-pixel.

According to another embodiment of the present disclosure, among the plurality of pixels P, the four pixels which are disposed adjacently or disposed along a length direction of the gate line (or data line) constitute a unit pixel. A unit pixel may include a red pixel, a green pixel, a blue pixel, and a white pixel, but embodiments of the present disclosure are not limited thereto. As an embodiment, the unit pixel may include at least one red pixel, at least one green pixel, at least one blue pixel, and at least one white pixel.

Each of the plurality of pixels P may include a pixel circuit, and a light emitting portion connected with the pixel circuit. The light emitting portion may include a light emitting device layer interposed between a first electrode and a second electrode.

The light emitting device layer disposed at each of the plurality of pixels P may emit individually different colored light or may emit white light in common. According to an embodiment of the present disclosure, if the plurality of pixels P emit white light in common, each of the red pixel, the green pixel, and the blue pixel may include a color filter (or wavelength conversion member or wavelength conversion layer) which converts white light to other colored light. In this case, a color filter according to an embodiment of the present disclosure may be not included in the white pixel. At least a portion of the white pixel according to another embodiment of the present disclosure may include a color filter whose color is identical to any one of the red pixel, the green pixel, and the blue pixel.

The non-display area IA is an area in which an image is not displayed. The non-display area IA may be a peripheral circuit area, a signal supply area, a non-active area, or a bezel area. The non-display area IA may surround the display area AA.

The non-display area IA may be disposed at the periphery of the display panel 10. The non-display area IA according to an embodiment of the present disclosure may include first to fourth non-display areas IA1, IA2, IA3, and IA4 disposed at the periphery of the substrate 100. For example, the non-display area IA may include the first non-display area IA1 which is disposed at or adjoin to the first side of the display area AA, the second non-display area IA2 which is disposed at or adjoin to the second side of the display area AA, the third non-display area IA3 which is disposed at or adjoin to the third side of the display area AA, and the fourth non-display area IA4 which is disposed at or adjoin to the fourth side of the display area AA. For example, each of the first and fourth non-display areas IA1 and IA4 may be parallel to a first direction X, and each of the second and third non-display areas IA2 and IA3 may be parallel to a second direction Y which is perpendicular to the first direction X.

Any one of the first to fourth non-display areas included in the non-display area IA may include a pad area. The pad area may be disposed at one or more among the first to fourth non-display areas IA1, IA2, IA3, and IA4 included in the non-display area IA exposed to the external without being overlaid with (or covered by) the opposite substrate 300. For example, the pad area may be disposed at the first non-display area IA1.

The display panel 10 or substrate 100 may further include a peripheral circuit portion 50 disposed at the non-display area IA.

The peripheral circuit portion 50 (or panel embedded circuit portion) may include a plurality of pad portions 51 and a plurality of link portions 53 disposed at the first non-display area IA1, a first gate driving circuit 55 disposed at the second non-display area IA2, and a second gate driving circuit 57 disposed at the third non-display area IA3.

The plurality of pad portions 51 may be disposed at the pad area of the first non-display area IA1 so as to be spaced apart from each other along the first direction X.

Each of the plurality of pad portions 51 according to an embodiment of the present disclosure may include a plurality of data pads, at least one pixel driving power pad, and a plurality of common power pads. The first pad portion connected with the first data line among the plurality of pad portions 51 may further include a plurality of gate pads. Also, the last pad portion connected with the last data line among the plurality of pad portions 51 may further include a plurality of gate pads.

Each of the plurality of data pads may receive a data signal supplied from a panel driving circuit part 30. Each of the plurality of data pads may receive a gate control signal and gate circuit driving power supplied from the panel driving circuit part 30. For example, the gate control signal may include at least one gate start signal and a plurality of gate clocks. For example, the gate circuit driving power may include high-potential power and low-potential power.

At least one pixel driving power pad may receive pixel driving power supplied from the panel driving circuit part 30. Each of the plurality of common power pads may receive pixel common power supplied from the panel driving circuit part 30.

Each of the plurality of link portions 53 may be disposed at a link area between the pad area of the first non-display area IA1 and the first side of the display area AA. The plurality of link portions 53 may be disposed at the link area of the first non-display area IA1 so as to be spaced apart from each other along the first direction X.

Each of the plurality of link portions 53 may include a plurality of data link lines. The plurality of data link lines may respectively connect the plurality of data pads with the plurality of data lines in one-to-one relationship.

The first gate driving circuit 55 may be disposed at the second non-display area IA2. The second gate driving circuit 57 may be disposed at the third non-display area IA3.

According to an embodiment of the present disclosure, the first gate driving circuit 55 may be electrically connected with each of the plurality of gate lines disposed at the display area AA, and the second gate driving circuit 57 may be electrically connected with each of the gate lines disposed at the display area AA. For example, the first gate driving circuit 55 may be connected with one side of each of the gate lines, and the second gate driving circuit 57 may be connected with the other side of each of the gate lines.

According to another embodiment of the present disclosure, the first gate driving circuit 55 may be electrically connected with each of the odd-numbered (or even-numbered) gate lines among the plurality of gate lines disposed at the display area AA, and the second gate driving circuit 57 may be electrically connected with each of the even-numbered (or odd-numbered) gate lines among the plurality of gate lines disposed at the display area AA. For example, the second gate driving circuit 55 may be connected with one side of each of the odd-numbered gate lines, and the second gate driving circuit 57 may be connected with the other side of each of the even-numbered gate lines.

The first gate driving circuit 55 may output gate signals sequentially shifted based on the gate control signal and gate circuit driving power supplied through a first gate control signal line 54 connected with the first pad portion among the plurality of pad portions 51. The second gate driving circuit 57 may output gate signals sequentially shifted based on the gate control signal and gate circuit driving power supplied through a second gate control signal line 56 connected with the last pad portion among the plurality of pad portions 51.

Each of the first gate driving circuit 55 and the second gate driving circuit 57 may be embodied in a shift register including a plurality of stages integrated in the non-display area IA of the substrate 100 according to a manufacturing process of a thin film transistor. The plurality of stages may be dependently connected with one another and sequentially driven according to the gate start signal of the gate control signal, at least one gate clock, and the gate circuit driving power, whereby the plurality of stage may sequentially output the gate signal (or gate pulse) corresponding to the gate clock signal.

The peripheral circuit portion 50 may further include a plurality of common electrode contact portions 58 disposed at the first non-display area IA1.

The plurality of common electrode contact portions 58 may be disposed between the plurality of link portions 53. Each of the plurality of common electrode contact portions 58 may be disposed between the two link portions 53 which are adjacent to each other along the first direction X. Each of the plurality of common electrode contact portions 58 may supply pixel common power, which is supplied through the plurality of common power pads, to the second electrode of each of the plurality of pixels in common. For example, the second electrode disposed at the display area AA and connected with each of the plurality of pixels P in common may include an extending portion which extends toward the first non-display area IA, and the extending portion of the second electrode may be overlapped with at least a portion or an entire portion of each of the plurality of common electrode contact portions 58.

The peripheral circuit portion 50 may further include a test circuit portion 59 disposed at the fourth non-display area IA4.

The test circuit portion 59 supplies a switching control signal and a test data signal, supplied from a test apparatus via a test pad portion disposed at the first non-display area IA1 or fourth non-display area IA4, to the data lines. For example, the test data signal may be a data signal for a pixel lighting test, but embodiments of the present disclosure are not limited thereto.

The test circuit portion 59 according to an embodiment of the present disclosure may include a plurality of transistors, a switching control line, and a plurality of signal supply lines.

The plurality of transistors may include a gate electrode, a first source/drain electrode, and a second source/drain electrode. For example, the first source/drain electrodes of each of the plurality of transistors may be connected with the data lines in one-to-one relationship.

The plurality of transistors may be grouped into a plurality of groups. For example, the plurality of transistors may be grouped into first to third groups or first to fourth groups. For example, the transistors included in the first group may be connected with the data lines connected with the red pixel, the transistors included in the second group may be connected with the data lines connected with the green pixel, and the transistors included in the third group may be connected with the data lines connected with the blue pixel. Additionally, the transistors included in the fourth group may be connected with the data lines connected with the white pixel.

The switching control line may be connected with each of the gate electrodes of the plurality of transistors in common.

The plurality of signal supply lines may be connected with the transistors included in each of the first to third groups among the plurality of transistors.

The first signal supply line among the plurality of signal supply lines may be connected with the respective second source/drain electrodes of the transistors included in the first group among the plurality of transistors in common. The first signal supply line may supply the first test data signal to the transistors included in the first group.

The second signal supply line among the plurality of signal supply lines may be connected with the each of the second source/drain electrodes of the transistors included in the second group among the plurality of transistors in common. The second signal supply line may supply the second test data signal to the transistors included in the second group.

The third signal supply line among the plurality of signal supply lines may be connected with the each of second source/drain electrodes of the transistors included in the third group among the plurality of transistors in common. The third signal supply line may supply the third test data signal to the transistors included in the third group.

Additionally, the fourth signal supply line among the plurality of signal supply lines may be connected with the each of second source/drain electrodes of the transistors included in the fourth group among the plurality of transistors in common. The fourth signal supply line may supply the fourth test data signal to the transistors included in the fourth group.

Figure 7:
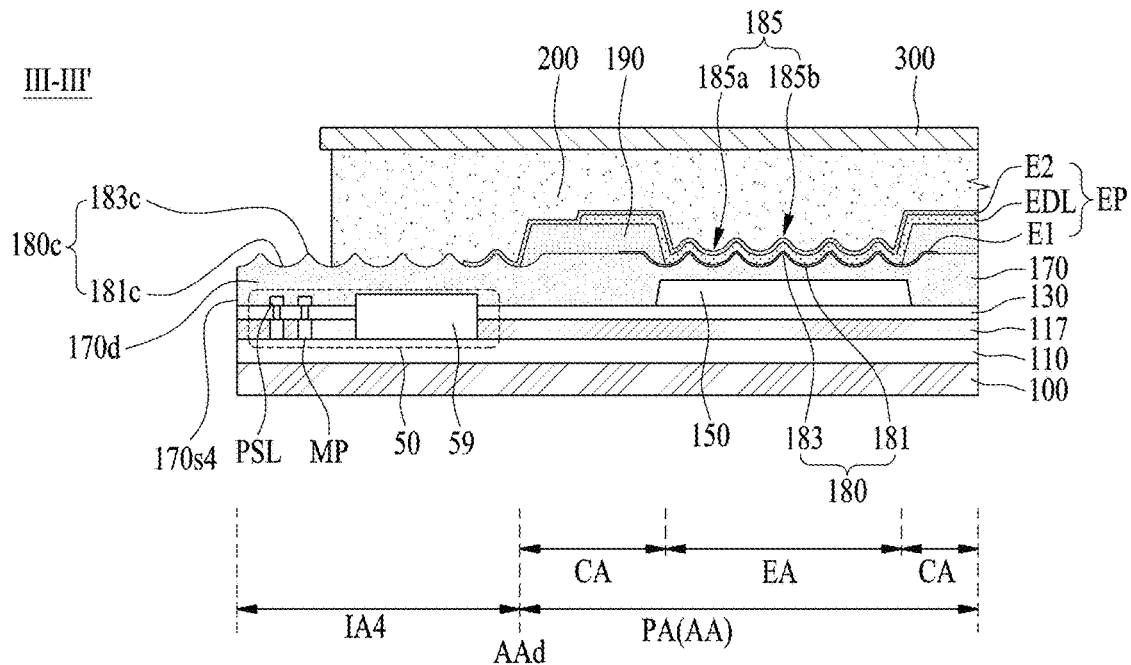
FIG. 7 is a cross-sectional view taken along III-III' of FIG. 1.

The peripheral circuit portion 50 may further include at least one power sharing line PSL (See FIG. 7) disposed at the fourth non-display area IA4, and a plurality of metal patterns MP (See FIG. 7).

At least one power sharing line PSL may be disposed at the fourth non-display area IA4 while being parallel to the first direction X, and may be connected with the ends of the pixel driving power lines disposed at the display area AA in common. At least one power sharing line PSL may receive pixel driving power supplied from at least one pixel driving power pad disposed at the first non-display area IA1 via the second non-display area IA2 and/or third non-display area IA3, and may supply the pixel driving power to the pixel driving power lines in common. In this case, the pixel driving power may be supplied to both ends of each of the pixel driving power lines at the same time, whereby it is possible to minimize a voltage drop phenomenon of the pixel driving power occurring in each of the pixel driving power lines.

The plurality of metal patterns MP may be disposed at the substrate 100 of the fourth non-display area IA4 overlapped with at least one power sharing line PSL. For example, the plurality of metal patterns MP may be arranged in at least one line (or one column) so as to be spaced apart from each other along the first direction X. At least one among the plurality of metal patterns MP may be electrically connected with at least one power sharing line PSL so that it is possible to reduce a line resistance of at least one power sharing line PSL.

The display panel 10 or substrate 100 may further include a planarization layer disposed at the display area AA and the remaining portions of the non-display area IA except the pad area of the non-display area IA.

The planarization layer may include an uneven pattern portion. For example, the planarization layer according to an embodiment of the present disclosure may include an uneven pattern portion disposed at the remaining portions of the non-display area IA except the pad area of the non-display area IA. The uneven pattern portion may not be disposed at the pad area.

The uneven pattern portion may include a plurality of concave portions that are concave from the surface of the planarization layer. The uneven pattern portion may further include a plurality of protruding portions disposed between each of the concave portions. For example, a plurality of protruding portions disposed convexly between each of the concave portions. The uneven pattern portion disposed at the non-display area IA may scatter external light which is incident through the substrate 100. Some of the light scattered by the uneven pattern portion may be emitted to the outside through the substrate 100 to haze (or blur) of the non-display area IA, thereby reducing or minimizing a color difference (or a difference in an impression of color) caused between the non-display area IA and the display area AA by a reflection of external light. For example, when the display panel 10 is turned-off or a black image is displayed at the display panel 10, a color difference (or a difference in an impression of color) between the non-display area IA and the display area AA caused by a reflection of external light due to the peripheral circuit portion 50 disposed at the non-display area IA may be reduced or minimized by the uneven pattern portion. This will be described later in detail.

The opposite substrate 300 may be bonded to the substrate 100 by using an adhesive member (or transparent adhesive). For example, the opposite substrate 300 is relatively smaller than the substrate 100, whereby the opposite substrate 300 may be bonded to the remaining areas of the substrate 100 except the pad portion 51. The opposite substrate 300 may be an upper substrate, a second substrate, or an encapsulation substrate. The opposite substrate 300 may be bonded to a first surface of the substrate 100 by a substrate bonding process using the adhesive member.

The panel driving circuit part 30 (or panel external circuit part) may be connected with the pad portion 51 of the display panel 10. The panel driving circuit part 30 drives (or emits light) the plurality of pixels P disposed at the display area AA based on video data supplied from a host driving system, thereby displays an image corresponding to the video data at the display area AA.

The panel driving circuit part 30 according to an embodiment of the present disclosure may include a plurality of flexible circuit films 31, a plurality of data driving integrated circuits 33, a printed circuit board 35, a timing controller 37, and a power circuit portion 39.

One side portion (or input bonding portion) in each of the plurality of flexible circuit films 31 may be attached to the printed circuit board 35 by a film attachment process using an anisotropic conductive film. The other side portion (or output bonding portion) in each of the plurality of flexible circuit films 31 may be attached to the pad portion 51 of the substrate 100 by a film attachment process using an anisotropic conductive film. Each of the plurality of flexible circuit films 31 may be bent or folded toward a rear surface of the opposite substrate 300 so as to surround a lateral surface of the opposite substrate 300. For example, the one side portion in each of the plurality of flexible circuit films 31 may be disposed at the rear surface of the opposite substrate 300.

Each of the plurality of data driving integrated circuits 33 may be individually mounted at each of the plurality of flexible circuit films 31. The plurality of data driving integrated circuits 33 may receive pixel data and data control signal from the timing controller 37, may convert the pixel data into an analog data signal for each pixel according to the data control signal, and may supply the analog data signal for each pixel to the corresponding data line. For example, the flexible circuit film 31 and the data driving integrated circuit 33 may be referred to as the data driving circuit, but embodiments of the present disclosure are not limited thereto.

The printed circuit board 35 may support the timing controller 37 and the power circuit portion 39, and may transmit the signal and power between elements of the panel driving circuit part 30. For example, the printed circuit board 35 may be disposed at the rear surface of the opposite substrate 300.

The timing controller 37 is mounted at the printed circuit board 35, and may receive the video data and timing synchronized signal provided from the host driving system through a user connector disposed at the printed circuit board 35. The timing controller 37 may generate pixel data by aligning the video data to be appropriate for a pixel arrangement structure of the display area AA based on the timing synchronized signal, and may provide the generated pixel data to the corresponding data driving integrated circuit 33. Also, the timing controller 37 may generate each of the data control signal and gate control signal based on the timing synchronized signal, may control a driving timing in each of the plurality of data driving integrated circuits 33 through the data control signal, and may control a driving timing of the first and second gate driving circuits 55, 57 through the gate control signal.

The power circuit portion 39 is mounted at the printed circuit board 35. The power circuit portion 39 may generate various voltages for displaying an image at the display panel 10 through the use of externally-provided input power, and may provide the generated voltages to the corresponding circuit.

Figure 2:
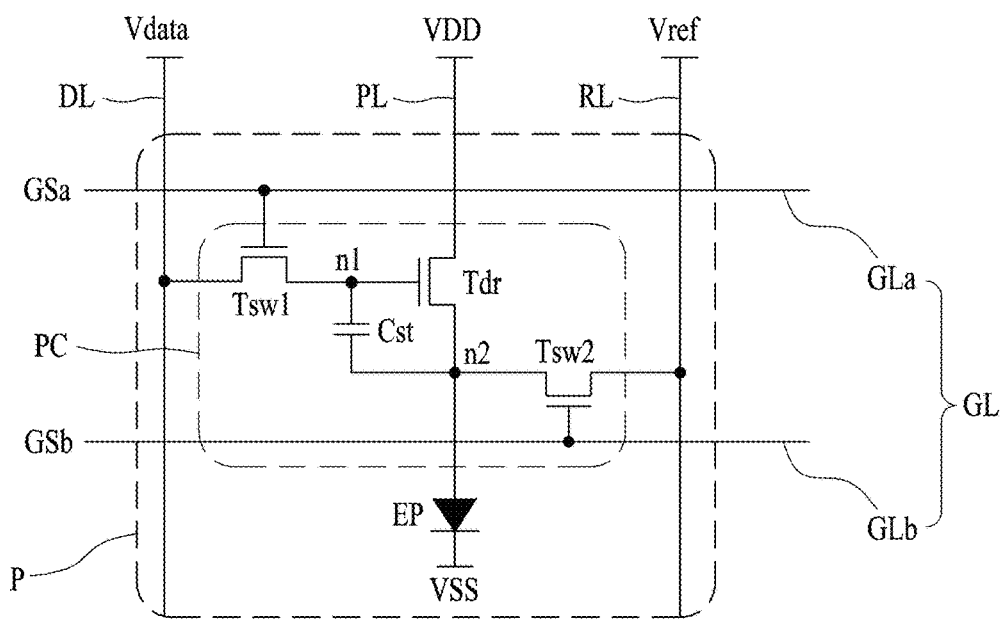
FIG. 2 is an equivalent circuit diagram illustrating a pixel shown in FIG. 1.

FIG. 2 is an equivalent circuit diagram illustrating a pixel shown in FIG. 1.

With reference to FIG. 2, the pixel P according to an embodiment of the present disclosure includes a pixel circuit PC and a light emitting portion EP.

The pixel circuit PC may include a first switching thin film transistor Tsw1, a second switching thin film transistor Tsw2, a driving thin film transistor Tdr, and a capacitor Cst. The thin film transistors Tsw1, Tsw2, and Tdr may be N-type thin film transistors (TFT), but embodiments of the present disclosure are not limited thereto.

As an embodiment, at least one of the first switching thin film transistor Tsw1, the second switching thin film transistor Tsw2, or the driving thin film transistor Tdr may include a semiconductor layer (or activation layer) based on any one of amorphous silicon, polycrystalline silicon, oxide, and organic materials.

As another embodiment, some thin film transistors among the first switching thin film transistor Tsw1, the second switching thin film transistor Tsw2, and the driving thin film transistor Tdr may include a semiconductor layer based on a low-temperature polycrystalline silicon (poly-Si) material having the good response properties, and the remaining thin film transistors thereof may be the thin film transistor including a semiconductor layer based an oxide material having the good off-current properties.

The first switching thin film transistor Tsw1 may include a gate electrode connected with a first gate line GLa of the gate line GL, a first source/drain electrode connected with the close data line DL, and a second source/drain electrode connected with a first node n1 corresponding to a gate electrode of the driving thin film transistor Tdr. The first switching thin film transistor Tsw1 may supply a data voltage, which is supplied to the data line DL according to a first gate signal GSa having a gate-on voltage level supplied to the first gate line GLa, to the first node n1 corresponding to the gate electrode of the driving thin film transistor Tdr.

The second switching thin film transistor Tsw2 may include a gate electrode connected with a second gate line GLb of the gate line GL, a first source/drain electrode connected with a close reference line RL, and a second source/drain electrode connected with a second node n2 corresponding to a source electrode of the driving thin film transistor Tdr. The second switching thin film transistor Tsw2 may supply a reference voltage Vref, which is supplied to the reference line RL according to a second gate signal GSb having a gate-on voltage level supplied to the second gate line GLb, to the second node (n2), that is, the source electrode of the driving thin film transistor Tdr.

The capacitor Cst may be provided between the gate electrode of the driving thin film transistor Tdr and the source electrode of the driving thin film transistor Tdr. The capacitor Cst according to an embodiment of the present disclosure may include a first capacitor electrode consisting of the gate electrode of the driving thin film transistor Tdr, a second capacitor electrode consisting of the source electrode of the driving thin film transistor Tdr, and a dielectric layer provided in an overlap area between the first capacitor electrode and the second capacitor electrode. The capacitor Cst may charge a differential voltage between the gate electrode of the driving thin film transistor Tdr and the source electrode of the driving thin film transistor Tdr, and then switch the driving thin film transistor Tdr according to the charged voltage.

The driving thin film transistor Tdr may include a gate electrode connected with the second source/drain electrode of the first switching thin film transistor Tsw1 and the first capacitor electrode of the capacitor Cst in common, a source electrode connected with the first source/drain electrode of the second switching thin film transistor Tsw2, the second capacitor electrode of the capacitor Cst, and the light emitting portion EP in common, and a drain electrode connected with the pixel driving power line PL. The driving thin film transistor Tdr may control an amount of current flowing from the pixel driving power line PL to the light emitting portion EP by turned-on by a voltage of the capacitor Cst.

The light emitting portion EP may emit light in proportion to a data current flowing from the pixel driving power line PL to low-potential power source VSS according to the driving of the pixel circuit PC.

The light emitting portion EP according to an embodiment of the present disclosure may include a first electrode, a light emitting device layer, and a second electrode. For example, the light emitting portion EP may be a self-light emitting portion, a light emitting portion, or a spot light source, but embodiments of the present disclosure are not limited thereto.

The first electrode may be electrically connected with the source electrode of the driving thin film transistor Tdr of the pixel circuit PC. The first electrode may be an anode electrode, a pixel electrode, or a transparent electrode, but embodiments of the present disclosure are not limited thereto.

The light emitting device layer may be provided over the first electrode. The light emitting device layer according to an embodiment of the present disclosure may be individually provided at each of the plurality of pixels. In this case, the light emitting device layer of each pixel may emit the different colored light. The light emitting device layer according to another embodiment of the present disclosure may be provided for the plurality of pixels in common. In this case, the light emitting device layer in each pixel may emit the same white light.

The light emitting device layer according to an embodiment of the present disclosure may be an organic light emitting layer, a quantum dot light emitting layer, or an inorganic light emitting layer, but embodiments of the present disclosure are not limited thereto. For example, the light emitting device layer may include a hole functional layer disposed at the first electrode, an organic light emitting layer disposed at the hole functional layer, and an electron functional layer disposed at the organic light emitting layer.

The second electrode may be provided on the light emitting device layer. The second electrode may be connected with the plurality of pixels in common, but embodiments of the present disclosure are not limited thereto. For example, the second electrode may be a cathode electrode, a common electrode, or a reflective electrode, but embodiments of the present disclosure are not limited thereto.

The reference line RL may be used as a sensing line which externally senses a characteristics variation of the driving thin film transistor Tdr and/or a characteristics variation of the light emitting device layer for a sensing driving mode of the pixel P. For example, an external sensing driving mode and an external compensation method based on the structure of the pixel P according to the embodiment of the present disclosure may be substantially identical to a sensing mode and an external compensation method disclosed in Korean Patent Publication No. 10-2016-0093179, 10-2017-0054654, or 10-2018-0002099, where all of these references are incorporated by reference into the present application. A related detailed description will be omitted.

In the aforementioned embodiment of the present disclosure, the pixel circuit PC comprises the three transistors and one capacitor. However, it is possible to variously change the number of transistors and capacitors constituting the pixel circuit PC.

Figure 3:
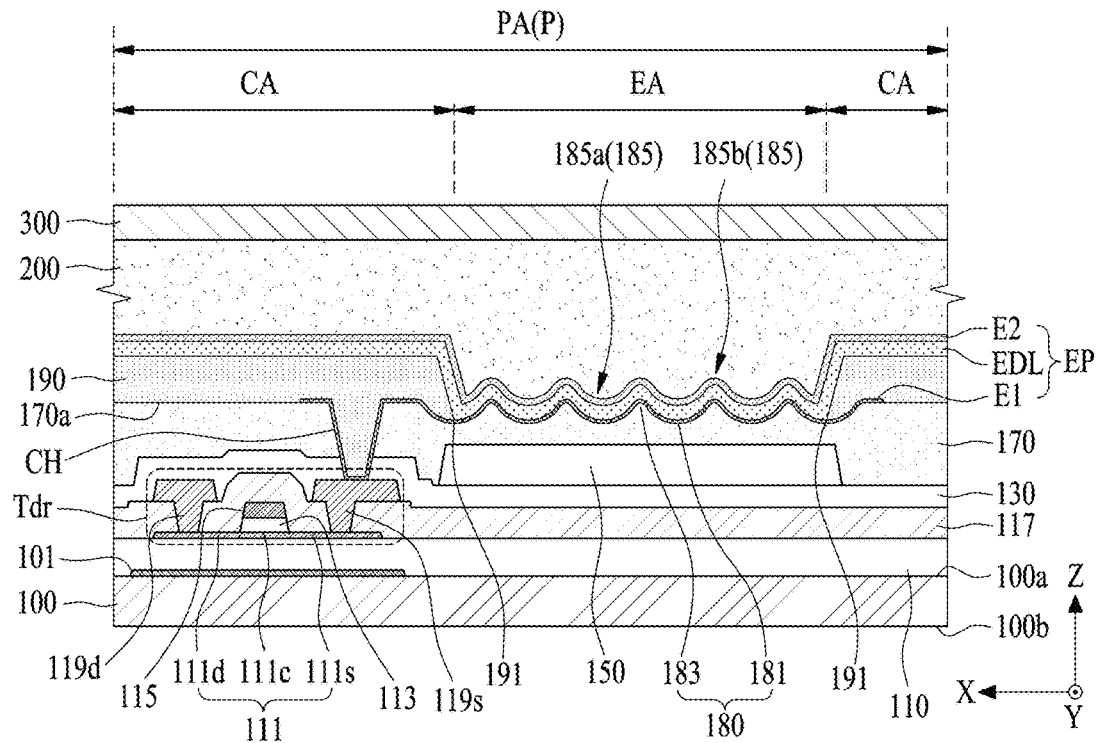
FIG. 3 is a cross sectional view illustrating a cross-sectional structure of a pixel according to an embodiment of the present disclosure.
Figure 4:
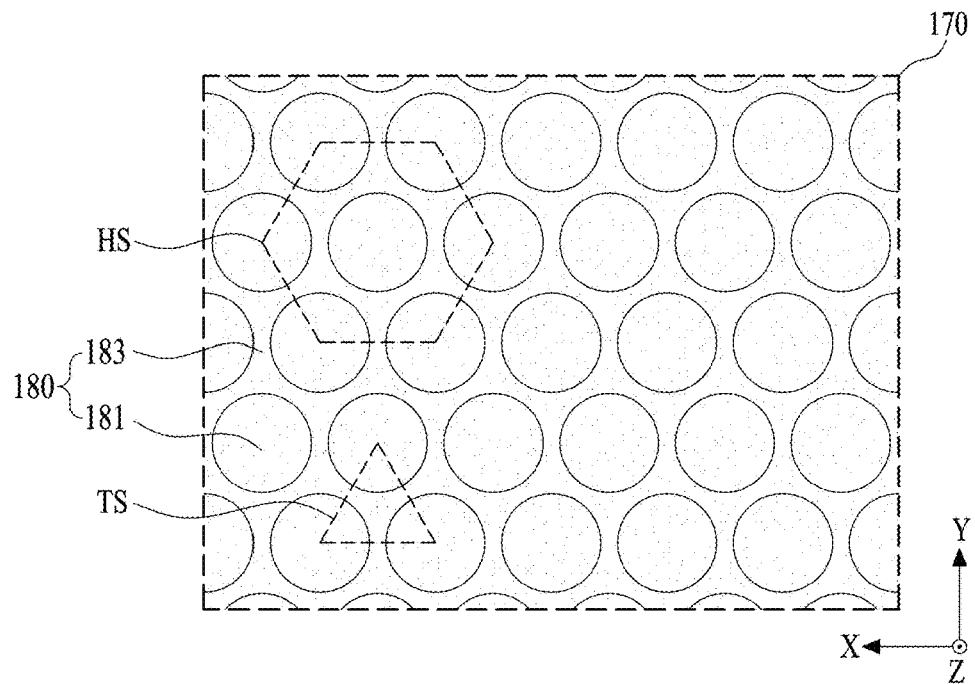
FIG. 4 illustrates a plan structure of a light extraction pattern shown in FIG. 3.

FIG. 3 is a cross sectional view illustrating a cross-sectional structure of a pixel according to an embodiment of the present disclosure. FIG. 4 illustrates a plan structure of a light extraction pattern shown in FIG. 3.

With reference to FIGS. 3 and 4, the light emitting display panel 10 (or light emitting display apparatus) according to an embodiment of the present disclosure may include the substrate 100 and the opposite substrate 300.

The substrate 100 may be generally formed of a glass material, but embodiments of the present disclosure are not limited thereto. The substrate 100 may be formed of a bendable or foldable transparent plastic material, for example, polyimide material.

The substrate 100 may include a plurality of pixel areas PA defined in the display area AA.

Each of the plurality of pixels areas PA may include a circuit area CA and an light emission area EA. The circuit area CA may be spatially separated from the light emission area EA inside the pixel area PA. The light emission area EA may be defined as the remaining portions of the pixel area PA except the circuit area CA. For example, the circuit area CA may be a non-emission area or a non-opening area. For example, the light emission area EA may be an opening area.

The substrate 100 according to an embodiment of the present disclosure may include a buffer layer 110, a pixel circuit portion, a protection layer 130, a planarization layer 170, and a light emitting portion EP.

The buffer layer 110 may be disposed at an entire area of a first surface (or front surface) 100a of the substrate 100. The buffer layer 110 may prevent materials contained in the substrate 100 from spreading to a transistor layer for a high-temperature step of a process for manufacturing a thin film transistor, or may prevent external water or moisture from being permeated into an emission device. Selectively, according to some embodiments of the present disclosure, the buffer layer 110 may be omitted.

The pixel circuit portion may include the driving thin film transistor Tdr disposed at the circuit area CA of the pixel area PA.

The driving thin film transistor Tdr according to an embodiment of the present disclosure may include an active layer 111, a gate insulating film 113, a gate electrode 115, an insulating interlayer 117, a drain electrode 119d, and a source electrode 119s.

The active layer 111 may include a channel region 111c, a drain region 111d, and a source region 111s provided at the driving thin film transistor area of the circuit area CA. The drain region 111d and the source region 111s may be spaced apart from in parallel to each other with the channel region 111c interposed therebetween.

The active layer 111 may be formed of a semiconductor material based on any one among amorphous silicon, polycrystalline silicon, oxide, and organic materials.

The gate insulating film 113 may be provided on the channel region 111c of the active layer 111. For example, the gate insulating film 113 may be provided in an island shape only on the channel region 111c of the active layer 111, or may be provided on the entire surface of the buffer layer 110 or substrate 100 including the active layer 111.

The gate electrode 115 may be provided on the gate insulating film 113 while being overlapped with the channel region 111c of the active layer 111.

The insulating interlayer 117 may be provided on the gate electrode 115 and the drain region 111d and source region 111s of the active layer 111. The insulating interlayer 117 may be provided at the entire areas of the light emission area EA and the circuit area CA. For example, the insulating interlayer 117 may be formed of an inorganic material or organic material.

The drain electrode 119d may be electrically connected with the drain region 111d of the active layer 111 via a drain contact hole prepared in the insulating interlayer 117 overlapped with the drain region 111d of the active layer 111.

The source electrode 119s may be electrically connected with the source region 111s of the active layer 111 via a source contact hole prepared in the insulating interlayer 117 overlapped with the source region 111s of the active layer 111.

The drain electrode 119d and the source electrode 111s may be formed of the same metal material. For example, each of the drain electrode 119d and the source electrode 111s may be formed in a single-layered structure of a metal material which is the same as or different from that of the gate electrode, a single-layered structure of an alloy which is the same as or different from that of the gate electrode, or a dual-layered structure of metal materials which are same as or different from those of the gate electrode.

Additionally, the pixel circuit portion may further include a capacitor and first and second switching thin film transistors disposed at the circuit area CA together with the driving thin film transistor Tdr. Each of the first and second switching thin film transistors is prepared in the circuit area CA of the pixel area PA, wherein each of the first and second switching thin film transistors is embodied to have the same structure as that of the driving thin film transistor Tdr. Repetitive descriptions for this structure will be omitted. The capacitor may be prepared at an overlap area between the gate electrode GE and the source electrode SE which overlap each other with the insulating interlayer 117 interposed in-between and are included in the driving thin film transistor Tdr.

Additionally, the thin film transistor prepared in the pixel circuit portion may have the properties related with a shift of a threshold voltage by light. To prevent this phenomenon, the display panel or first substrate 100 may further include a light shielding layer 101 prepared below the active layer 111 of at least one of the driving thin film transistor Tdr, the first switching thin film transistor, or the second switching thin film transistor. The light shielding layer 101 is prepared between the substrate 100 and the active layer 111, and the light shielding layer 101 prevents light which is incident at the active layer 111 through the substrate 100, to thereby minimize the change of threshold voltage in the transistor caused by the external light.

The protection layer 130 may be prepared over the substrate 100 so as to cover (or overlay) the pixel circuit portion. The protection layer 130 covers (or overlays) the drain electrode 119d of the driving thin film transistor Tdr, the source electrode 119s of the driving thin film transistor Tdr, and the insulating interlayer 117. The protection layer 130 may be provided over the entire area of the pixel area CA and the light emission area EA. For example, the protection layer 130 may be referred to as a passivation layer. Selectively, according to some embodiments of the present disclosure, the protection layer 130 may be omitted.

The planarization layer 170 may be provided over the substrate 100 so as to cover (or overlay) the protection layer 130. When the protection layer 130 is omitted, the planarization layer 170 may be prepared over the substrate 100 so as to cover (or overlay) the pixel circuit portion. The planarization layer 170 may be provided over the entire areas of the circuit area CA and the light emission area EA. Also, the planarization layer 170 may be provided over the entire display area and the remaining portions of the non-display area except the pad area. For example, the planarization layer 170 may include an extension portion (or expansion portion) extended or expanded from the display area to the remaining portions of the non-display area except the pad area. Accordingly, the planarization layer 170 may have a relatively large size in comparison to the display area. For example, the planarization layer 170 may be disposed at the display area AA and partially at the non-display area. The planarization layer 170 may be disposed at the remaining non-display area except the pad area among the non-display area.

The planarization layer 170 according to an embodiment of the present disclosure has a relatively large thickness so that the planarization layer 170 may provide a planarized surface in the display area AA. For example, the planarization layer 170 may be formed of an organic material such as photo acryl, benzocyclobutene, polyimide, and fluorine resin, but embodiments of the present disclosure are not limited thereto.

The planarization layer 170 may include a light extraction pattern 180 disposed at the pixel area PA. The light extraction pattern 180 may be provided at an upper surface 170a of the planarization layer 170 while being overlapped with the light emission area EA of the pixel area PA. The light extraction pattern 180 is provided at the planarization layer 170 of the light emission area EA to have a curved (or uneven) shape, whereby a progress path of light emitted from the light emitting device layer EDL is changed to increase light extraction efficiency of the pixel P. The light extraction pattern 180 may have a relatively large size in comparison to the light emission area EA of the pixel area PA. For example, the light extraction pattern 180 may be an uneven pattern portion, a microlens, a light scattering pattern, a fine structure, a light path controller, a microlens portion, or a microlens array portion, but embodiments of the present disclosure are not limited thereto.

The light extraction pattern 180 according to an embodiment of the present disclosure may be disposed at the planarization layer 170 overlapped with at least one light emission area EA among the plurality of pixels P constituting one unit pixel. As an embodiment, the light extraction pattern 180 may be disposed at the planarization layer 170 overlapped with the light emission area EA of the green pixel and/or blue pixel included in one unit pixel according to an emission efficiency, an external light extraction efficiency, and a luminance in each of the plurality of pixels P constituting one unit pixel, but embodiments of the present disclosure are not limited thereto. As another embodiment, the light extraction pattern 180 may be disposed at the planarization layer 170 overlapped with the light emission area EA of the white pixel among the plurality of pixels P constituting one unit pixel, or may be disposed at the planarization layer 170 overlapped at least one light emission area EA of the green pixel, the blue pixel, and the white pixel included in one unit pixel, but embodiments of the present disclosure are not limited thereto.

The light extraction pattern 180 according to an embodiment of the present disclosure may include a plurality of concave portions 181 and a protruding portion 183 disposed between the plurality of concave portions 181. For example, the concave portion 181 may be a recess portion, a depression portion, a valley portion, or a groove portion. The protruding portion 183 may be a convex portion, a ridge portion, or an embossing portion.

Each of the plurality of concave portions 181 may be configured to be recessed from an upper surface 170a of the planarization layer 170. Each of the plurality of concave portions 181 may have the same depth with respect to the upper surface 170a of the planarization layer 170. However, some of the plurality of concave portions 181 may have the different depths due to an error or tolerance range for a patterning process of the light extraction pattern 180.

The plurality of concave portions 181 may respectively be arranged in parallel in a zigzag shape along the second direction Y while being spaced apart from each other along the first direction X. For example, the plurality of concave portions 181 are arranged in a lattice shape having a constant interval, and the concave portions 181 adjacent to each other may be disposed alternately along the second direction Y. Three adjacent concave portions 181 may be disposed in two-dimensionally triangular shape, and line segments among centers of three adjacent concave portions 181 may constitute two-dimensionally triangular shape TS. Also, the plurality of concave portions 181 may respectively be surrounded by six concave portions 181 disposed around them. In this case, six concave portions 181 disposed to surround one concave portion 181 may be disposed in two-dimensionally hexagonal shape HS, and line segments among centers of six concave portions 181 disposed to surround one concave portion 181 may constitute two-dimensionally hexagonal shape HS. For example, the protruding portion 183 and the plurality of concave portions 181 may be disposed or arranged in two-dimensionally honeycomb shape or a hexagonal shape.

A pitch (or interval) between the concave portions 181 arranged in the plurality of pixels P constituting one unit pixel may be the same or different from each other. Herein, the pitch between the concave portions 181 may be a distance (or interval) between central points of the two adjacent concave portions 181.

As an embodiment, a pitch between the concave portions 181 disposed at the red pixel, the green pixel, and the blue pixel constituting one unit pixel may be the same or different from each other. For example, a pitch between the concave portions 181 disposed at the green pixel may be different from a pitch between the concave portions 181 disposed at the blue pixel.

As another embodiment, a pitch between the concave portions 181 disposed at the red pixel, the green pixel, the blue pixel, and the white pixel constituting one unit pixel may be the same or different from each other. For example, a pitch between the concave portions 181 disposed at one or more among the white pixel and the green pixel may be different from a pitch between the concave portions 181 disposed at one or more among the red pixel and the blue pixel.

The protruding portion 183 may be provided at the planarization layer 170 overlapped with the light emission portion EP to have a shape that may maximize external extraction efficiency of light emitted from a pixel P based on an effective light emission area of the light emitting portion EP. The protruding portion 183 may increase external extraction efficiency of light emitted from the light emitting portion EP by changing the progress path of the light emitted from the light emitting portion EP toward the substrate 100.

The protruding portion 183 may be configured to individually surround each of the plurality of concave portions 181. For example, the protruding portion 183 may include a bottom surface (or base surface) of each of the concave portions 181, and an inclined surface which is inclined from the bottom surface to all directions. Accordingly, the planarization layer 170 overlapped with at least a portion of the light emission area EA may include the plurality of concave portions 181 surrounded by the protruding portion 183. The protruding portion 183 surrounding one concave portion 181 may be disposed in two-dimensionally hexagonal shape (or honeycomb shape). For example, the protruding portion 183 may be arranged to have a hexagonal shape (or a honeycomb structure).

The light extraction pattern 180 according to an embodiment of the present disclosure may be formed through an etching process of the planarization layer 170 using a mask pattern after the mask pattern is formed over the planarization layer 170 of the light emission portion EP through a photolithography process using a photoresist. For example, a positive photoresist may be used as the photoresist to improve productivity.

The light emitting portion EP is disposed at the light extraction pattern 180 of the light emission area EA, and the light emitting portion EP may emit the light toward the substrate 100 according to a bottom emission type, but embodiments of the present disclosure are not limited thereto.

The light emitting portion EP according to an embodiment of the present disclosure may include a first electrode E1, a light emitting device layer EDL, and a second electrode E2.

The first electrode E1 is provided over the planarization layer 170 of the pixel area PA, and the first electrode E1 may be electrically connected with the source electrode 119s of the driving thin film transistor Tdr. One end of the first electrode E1 which is close to the circuit area CA extends onto the source electrode 119s of the driving thin film transistor Tdr, and then may be electrically connected to the source electrode 119s of the driving thin film transistor via an electrode contact hole CH prepared in the planarization layer 170 and the protection layer 130.

The first electrode E1 directly contacts the light extraction pattern 180, whereby the first electrode E1 has a shape corresponding to the light extraction pattern 180. As the first electrode E1 is provided (or deposited) on the planarization layer 170, and is embodied to have a relatively small thickness, the first electrode E1 may have a surface morphology (or second surface shape) corresponding to a surface morphology (or first surface shape) of the light extraction pattern 180 including the protruding portion 183 and the plurality of concave portions 181. For example, the first electrode E1 is formed in a conformal shape based on the surface shape (morphology) of the light extraction pattern 180 by a deposition process of a transparent conductive material, whereby the first electrode E1 may have a cross-sectional structure whose shape is the same as that of the light extraction pattern 180.

The light emitting device layer EDL is provided on the first electrode E1, and the light emitting device layer EDL may directly contact the first electrode E1. As the light emitting device layer EDL is provided (or deposited) on the first electrode E1, and is embodied to have a relatively large thickness in comparison to the first electrode E1, the light emitting device layer EDL may have a surface morphology (or third surface shape) which is different from the surface morphology in each of the protruding portion 183 and the plurality of concave portions 181 or the surface morphology of the first electrode E1. For example, the light emitting device layer EDL is formed in a non-conformal shape which does not conform to the surface shape (or morphology) of the first electrode E1 by a deposition process, whereby the light emitting device layer EDL may have a cross-sectional structure whose shape is different from that of the first electrode E1.

The light emitting device layer EDL according to an embodiment of the present disclosure may be embodied to have a gradually-increased thickness toward the bottom surface of the concave portion 181 or the protruding portion 183. For example, the light emitting device layer EDL may be embodied to have a first thickness over the top of the protruding portion 183, and a second thickness over the bottom surface of the concave portion 181, wherein the second thickness is relatively larger than the first thickness, and a third thickness over the inclined surface (or curved surface) of the protruding portion 183, wherein the third thickness is relatively smaller than the first thickness. Herein, each of the first, second, and third thicknesses may be the shortest distance between the first electrode E1 and the second electrode E2.

The light emitting device layer EDL according to an embodiment of the present disclosure includes two or more light emitting layers for emitting white light. As an embodiment, the light emitting device layer EDL may include a first light emitting layer and a second light emitting layer to emit white light by a mixture of first light and second light. For example, the first light emitting layer may include any one selected among a blue light emitting layer, a green light emitting layer, a red light emitting layer, a yellow light emitting layer, and a yellow-green light emitting layer to emit the first light. For example, the second light emitting layer may include a light emitting layer capable of emitting the second light so as to obtain white light in the light emitting portion EP by a mixture with the first light of a blue light emitting layer, a green light emitting layer, a red light emitting layer, a yellow light emitting layer, or a yellow-green light emitting layer.

As another embodiment, the light emitting device layer EDL may include any one selected among a blue light emitting layer, a green light emitting layer, and a red light emitting layer. For example, when the pixel P is the red pixel, the light emitting device layer EDL of the red pixel may include the red light emitting layer. When the pixel P is the green pixel, the light emitting device layer EDL of the green pixel may include the green light emitting layer. When the pixel P is the blue pixel, the light emitting device layer EDL of the blue pixel may include the blue light emitting layer.

The second electrode E2 is provided on the light emitting device layer EDL, and the second electrode E2 may directly contact the light emitting device layer EDL. The second electrode E2 may be formed (or deposited) on the light emitting device layer EDL to have a relatively small thickness than that of the light emitting device layer EDL. The second electrode E2 may be formed (or deposited) on the light emitting device layer EDL to have a relatively small thickness, and thus may have a surface morphology corresponding to the surface morphology of the light emitting device layer EDL. For example, the second electrode E2 is formed in a conformal shape corresponding to the surface shape (or morphology) of the light emitting device layer EDL by a deposition process, whereby the second electrode E2 may have the same cross-sectional structure as the light emitting device layer EDL.

The second electrode E2 according to an embodiment of the present disclosure may include a metal material having a high reflectance so as to reflect the incident light emitted from the light emitting device layer EDL toward the substrate 100. For example, the second electrode E2 may include a single-layered structure or multi-layered structure of any one material selected from aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba).

The light emitting portion EP is disposed at the light extraction pattern 180, and thus, may include a non-planar portion 185 disposed at the light emission area EA.

The non-planar portion (or a non-flat portion) 185 may have an undulated shape. The non-planar portion (or a non-flat portion) 185 may include a plurality of concave portions 185a and protruding portion 185b between each of the plurality of concave portions 185a.

In the non-planar portion 185, each of the plurality of concave portions 185a may be overlapped with each of the plurality of concave portions 181 of the light extraction pattern 180, and the protruding portion 185*b* may be overlapped with at least a portion of the protruding portion 183 of the light extraction pattern 180. A progress path of the light emitted from the light emitting portion EP may be changed to the substrate 100 by the non-planar portion 185 having the plurality of concave portions 185*a* and protruding portion 185*b*, to thereby improve or maximize an external extraction efficiency of the light emitted from the light emitting portion EP.

The substrate 100 according to an embodiment of the present disclosure may further include a wavelength conversion layer 150. The wavelength conversion layer 150 may be disposed between the substrate 100 and the planarization layer 170 to overlap with at least a portion of the light emission area EA of at least one among the plurality of pixel areas PA.

The wavelength conversion layer 150 according to an embodiment of the present disclosure may be disposed between the protection layer 130 and the planarization layer 170 to overlap with at least a portion of the light emission area EA. The wavelength conversion layer 150 according to another embodiment of the present disclosure may be disposed between the substrate 100 and the insulating interlayer 117 or between insulating interlayer 117 and the protection layer 130 to overlap with at least a portion of the light emission area EA.

The wavelength conversion layer 150 may have a relatively large size than the light emission area EA. For example, the wavelength conversion layer 150 may be relatively larger than the light emission area EA, and may be relatively smaller than the light extraction pattern 180 of the planarization layer 170.

The wavelength conversion layer 150 according to the first embodiment of the present disclosure includes a color filter which transmits only the wavelength corresponding to a color in the pixel among the light emitted from the light emitting portion EP toward the substrate 100. For example, the wavelength conversion layer 150 may transmit only the red wavelength, green wavelength, or blue wavelength. As an embodiment, in the light emitting display apparatus according to the present disclosure, when one unit pixel comprises adjacent first to third pixels, the wavelength conversion layer provided at the first pixel may include a red color filter, the wavelength conversion layer provided at the second pixel may include a green color filter, and the wavelength conversion layer provided at the third pixel may include a blue color filter. Additionally, one unit pixel may further include a white pixel without the wavelength conversion layer.

The wavelength conversion layer 150 according to the second embodiment of the present disclosure may include a quantum dot. For example, the wavelength conversion layer of the first pixel may include a quantum dot of CdSe or InP, the wavelength conversion layer of the second pixel may include a quantum dot of CdZnSeS, and the wavelength conversion layer of the third pixel may include a quantum dot of ZnSe, but embodiments of the present disclosure are not limited thereto. The quantum dot included in the wavelength conversion layer 150 is re-emitted according to the light emitted from the light emitting portion EP to the substrate 100, to thereby improve a color realization ratio of the pixel or light emitting display apparatus.

The first substrate 100 according to an embodiment of the present disclosure may further include a bank layer 190.

The bank layer 190 (or bank pattern) may define the light emission area EA of the pixel area PA. The bank layer 190 may be disposed at the planarization layer 170 and the edge of the first electrode E1. The bank layer 190 may be overlapped with at least a portion of the edge of the wavelength conversion layer 150. For example, the bank layer 190 may be formed of an organic material such as belzocyclobutene (BCB) based resin, acryl based resin, or polyimide resin. For example, the bank layer 190 may be formed of a photosensitizer including a black pigment. In this case, the bank layer 190 may also function as a light shielding member between the neighboring pixels.

The bank layer 190 according to an embodiment of the present disclosure may be provided over the upper surface 170*a* of the planarization layer 170 to cover (or overlay) the edge of the first electrode E1 extending onto the circuit area CA of the pixel area PA.

The bank layer 190 according to another embodiment of the present disclosure may be disposed to cover (or overlay) the edge of the light extraction pattern 180. The light emitting device layer EDL may be provided on the first electrode E1, the bank layer 190, and a step difference portion between the first electrode E1 and the bank layer 190. When the light emitting device layer EDL is provided at a small thickness at the step difference portion between the first electrode E1 and the bank layer 190, there might be an electrical contact (or short) between the second electrode E2 and the first electrode E1 due to a thickness reduction of the light emitting device layer EDL. In order to prevent this problem, one end 191 of the bank layer 190 is disposed at the edge of the light extraction pattern 180 so that it is possible to reduce a step difference between the first electrode E1 and the bank layer 190. For example, one end 191 of the bank layer 190 may define the end of the light emission area EA in the pixel area PA, or may define the boundary line between the circuit area CA and the light emission area EA. The end 191 of the bank layer 190 may be positioned over the concave portion 181 of the light extraction pattern 180. Thus, the light emission area EA defined by the bank layer 190 may be relatively smaller in size than the light extraction pattern 180 of the planarization layer 170 in a two-dimensional structure.

Each of the light emitting device layer EDL and the second electrode E2 of the light emitting portion EP is further provided over the bank layer 190. For example, the light emitting device layer EDL is provided over the substrate 100 with the first electrode E1 and the bank layer 190 provided thereon, and the second electrode E2 is provided to cover (or overlay) the light emitting device layer EDL.

The opposite substrate 300 may be an opaque glass substrate, an opaque plastic substrate, or an opaque metal substrate, but embodiments of the present disclosure are not limited thereto.

The substrate 100 and the opposite substrate 300 may be bonded to each other through an adhesive member 200.

The adhesive member 200 may be disposed between the substrate 100 and the opposite substrate 300, whereby the substrate 100 and the opposite substrate 300 may be bonded to each other through the adhesive member 200. For example, the adhesive member 200 may include a thermo-curable transparent adhesive or a photo-curable transparent adhesive. The adhesive member 200 may contain an absorbent material for absorbing external water or moisture permeating into the light emitting portion EP.

The adhesive member 200 is provided to surround the display area AA, and may directly contact the planarization layer 170 disposed at the non-display area IA.

The opposite substrate 300 may have a relatively large size in comparison to the adhesive member 200 so as to ensure a margin of a substrate bonding process and so as to prevent an overflow of the adhesive member 200. For example, each lateral surface (or sidewall) of the adhesive member 200 may be covered (or overlaid) by the opposite substrate 300. For example, each lateral surface (or sidewall) of the opposite substrate 300 may outwardly protrude from each lateral surface of the adhesive member 200.

Additionally, the first substrate 100 according to an embodiment of the present disclosure may further include an encapsulation layer disposed between the adhesive member 200 and the light emitting portion EP. The encapsulation layer may include a first inorganic layer configured to completely surround the light emitting portion EP, an organic layer disposed at the first inorganic layer, and a second inorganic layer configured to completely surround the organic layer. The second inorganic layer may directly contact the edge of the first inorganic layer. The organic layer may be sealed by the first inorganic layer and the second inorganic layer. The adhesive member 200 may be configured to surround the second inorganic layer.

Additionally, the first substrate 100 according to an embodiment of the present disclosure may further include an optical film disposed at a second surface 100b which is opposite to the first surface 100a.

The second surface 100b of the first substrate 100 may be a rear surface of the first substrate 100 or a light extraction surface.

The optical film may further include a polarizing film attached to the second surface 100b of the substrate 100. The polarizing film changes external light which is reflected by the film transistors and/or the lines which are provided in the display area into a circularly polarized state to improve visibility and a contrast ratio of the light emitting display device. For example, the optical film may be configured as a circularly polarization film.

Figure 5:
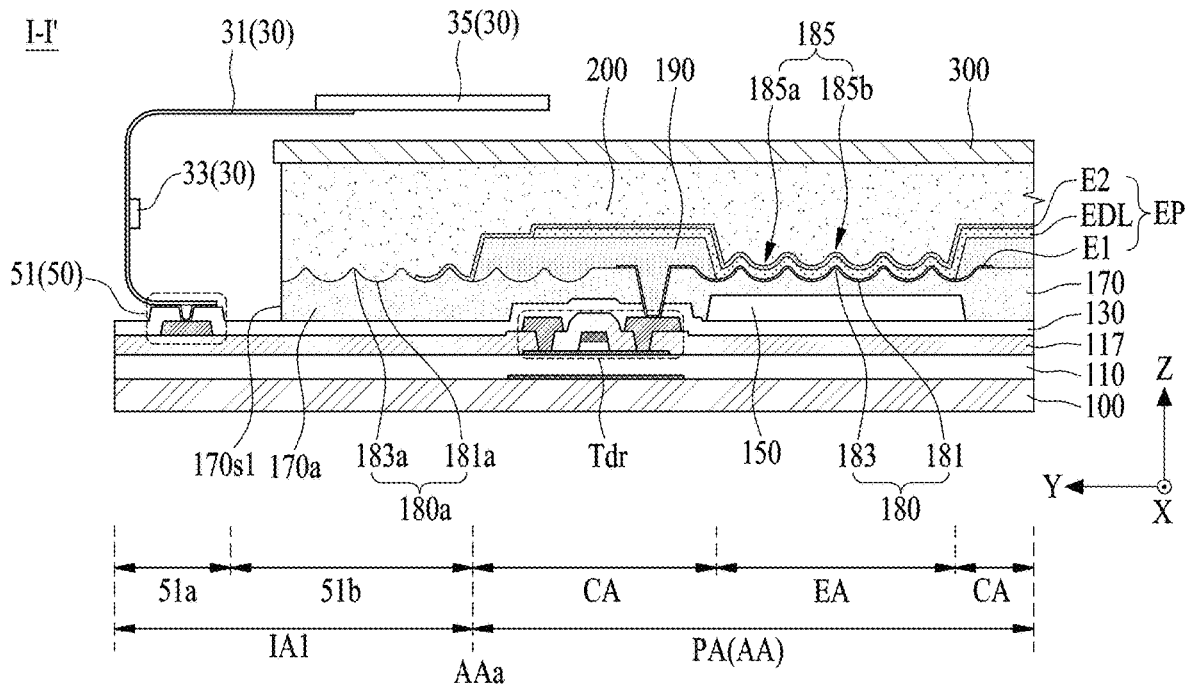
FIG. 5 is a cross-sectional view taken along I-I' of FIG. 1.

FIG. 5 is a cross-sectional view taken along I-I' shown in FIG. 1, which explains a first uneven pattern portion according to an embodiment of the present disclosure. Hereinafter, repetitive descriptions of the remaining elements except the first uneven pattern portion and related elements may be omitted or will be briefly given.

With reference to FIGS. 1 and 5, in the first substrate 100 or display panel 10 according to an embodiment of the present disclosure, the planarization layer 170 may include a first extending portion 170a which extends or expands from a first side AAa of the display area AA to the pad portion 51 of the first non-display area IA1.

An end 170s1 of the first extending portion 170a (or first side of the planarization layer) may be disposed between the lateral surface of the substrate 100 and the first side AAa of the display area AA. The first extending portion 170a according to an embodiment of the present disclosure may be disposed at the remaining portions of the first non-display area IA1 except a pad area 51a. For example, in the first non-display area IA1 of the substrate 100, the first extending portion 170a may be disposed at the remaining portions except one edge of a link area 51b adjacent to the pad area 51a. Accordingly, the first side 170s1 of the planarization layer 170 may be disposed between the pad portion 51 and the first side AAa of the display area AA.

A distance between the lateral surface of the substrate 100 and the first side 170s1 of the planarization layer 170 or a distance between the pad portion 51 and the first side 170s1 of the planarization layer 170 may be preset based on a process margin of a film attachment process for attaching the flexible circuit film 31 to the pad portion 51.

The planarization layer 170 may further include an uneven pattern portion 180a disposed at the first extending portion 170a. For example, the uneven pattern portion 180a disposed at the first extending portion 170a of the planarization layer 170 may be the first uneven pattern portion 180a.

The first uneven pattern portion 180a may include a plurality of first concave portions 181a and a first protruding portions 183a disposed between the plurality of concave portions 181a. The first concave portions 181a and first protruding portions 183a in the first uneven pattern portion 180a are identical in structure to the concave portions 181 and protruding portions 183 in the light extraction pattern 180 disposed at the light emission area EA of the pixel area PA, thus, their repetitive descriptions may be omitted.

The first uneven pattern portion 180a may be covered (or overlaid) by the adhesive member 200. For example, the adhesive member 200 may directly contact the first uneven pattern portion 180a.

According to an embodiment of the present disclosure, a pitch (or interval) between the first concave portions 181a of the first uneven pattern portion 180a disposed at the first non-display area IA1 may be the same as a pitch (or interval) between the concave portions 181 of the light extraction pattern 180 disposed at the display area AA. According to an embodiment of the present disclosure, the number of first concave portions 181a by each unit area of the first uneven pattern portion 180a disposed at the first non-display area IA1 may be the same as the number of concave portions 181 by each unit area of the light extraction pattern 180 disposed at the display area AA.

The first uneven pattern portion 180a may scatter external light which is incident through the first non-display area IA1. For example, some of the light which is incident on the first non-display area IA1 of the substrate 100 may be scattered at the first uneven pattern portion 180a through between the data link lines of the peripheral circuit portion 50 disposed at the first non-display area IA1 of the substrate 100. Some of the light scattered by the first uneven pattern portion 180a may pass through between the data link lines again, and then emitted again to the external (or outside) through the substrate 100. Thus, according as first light reflected by the data link lines is mixed with second light scattered by the first uneven pattern portion 180a in the first non-display area IA1 of the substrate 100, visibility of the first light may be reduced or minimized, and the data link lines of the peripheral circuit portion 50 may be not visible due to a haze or blurring of the first light. According to an embodiment of the present disclosure, when the external light is incident on the first non-display area IA1 of the substrate 100, the first non-display area IA1 may have a constant haze value by the mixture of the first light and the second light.

The first uneven pattern portion 180a may be further provided at the first extending portion 170a of the planarization layer 170 disposed at the first non-display area IA1 of the substrate 100 as well as some portions of the planarization layer 170 of the outermost pixel area PA adjacent to the first non-display area IA1 of the substrate 100.

In the light emitting display apparatus including the first uneven pattern portion 180a, the first non-display area IA1 of the substrate 100 is blurred due to the light scattered of the external light by the first uneven pattern portion 180a, whereby visibility of the peripheral circuit portion 50 disposed at the first non-display area IA1 may be minimized or reduced. Thus, when the display panel 10 is in a turn-off state or a black image is displayed at the display panel 10, a color difference (or a difference in an impression of color) between the non-display area IA and the display area AA caused by a reflection of external light due to the peripheral circuit portion 50 disposed at the non-display area IA may be reduced or minimized by the uneven pattern portion (or the first uneven pattern portion 180*a*).

Figure 6:
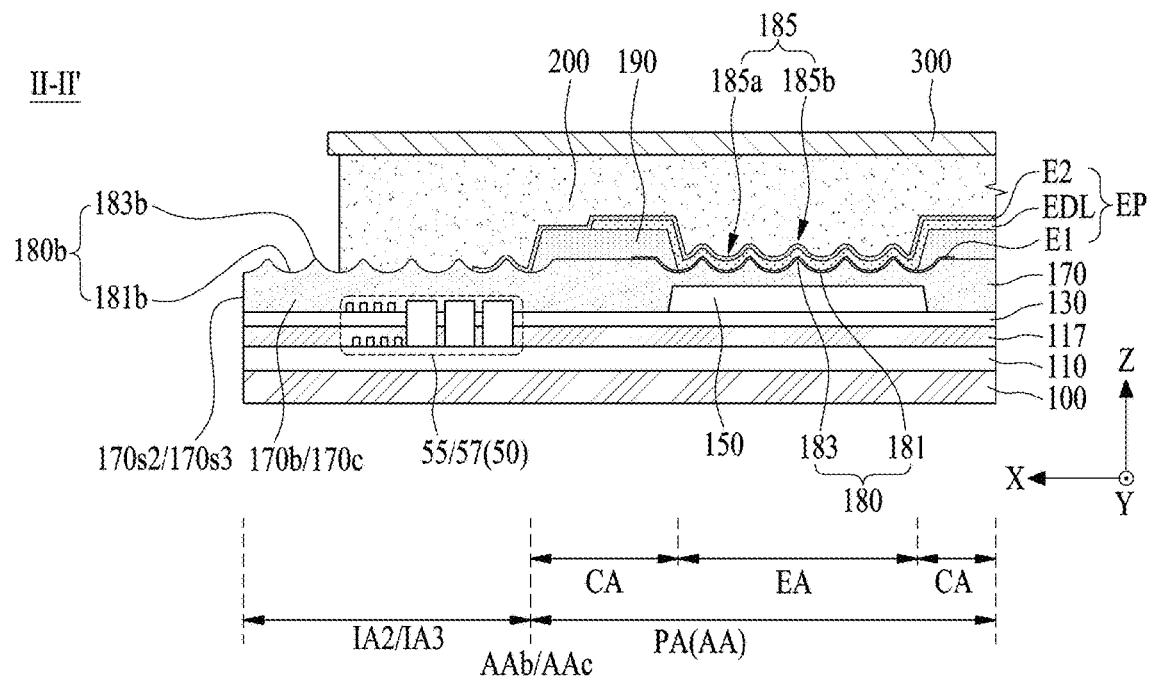
FIG. 6 is a cross-sectional view taken along II-II' of FIG. 1.

FIG. 6 is a cross-sectional view taken along II-II' shown in FIG. 1, which explains a second uneven pattern portion according to an embodiment of the present disclosure. Hereinafter, repetitive descriptions of the remaining elements except the second uneven pattern portion and related elements may be omitted or will be briefly given.

With reference to FIGS. 1 and 6, in the first substrate 100 or display panel 10 according to an embodiment of the present disclosure, the planarization layer 170 may include a second extending portion 170*b* which extends or expands from a second side AAb of the display area AA to the second non-display area IA2, and a third extending portion 170*c* which extends or expands from a third side AAc of the display area AA to the third non-display area IA3.

The second extending portion 170*b* may extend from the second side AAb of the display area AA to the end of the second non-display area IA2. For example, an end 170*s*2 of the second extending portion 170*b* (or second side of the planarization layer) may be positioned or aligned at the lateral surface of the substrate 100. For example, the second extending portion 170*b* may cover (or overlay) the entire second non-display area IA2.

The third extending portion 170*c* may extend from the third side AAc of the display area AA to the end of the third non-display area IA3. For example, an end 170*s*3 of the third extending portion 170*c* (or third side of the planarization layer) may be positioned or aligned at the lateral surface of the substrate 100. For example, the third extending portion 170*c* may cover (or overlay) the entire third non-display area IA3.

The planarization layer 170 may further include an uneven pattern portion 180*b* disposed at each of the second extending portion 170*b* and the third extending portion 170*c*. For example, the uneven pattern portion 180*b* disposed at the second extending portion 170*b* and the third extending portion 170*c* of the planarization layer 170 may be the second uneven pattern portion 180*b*.

The second uneven pattern portion 180*b* may be provided at the entire planarization layer 170 disposed at each of the second non-display area IA2 and the third non-display area IA3.

The second uneven pattern portion 180*b* may include a plurality of second concave portions 181*b* and a second protruding portion 183*b* disposed between the plurality of second concave portions 181*b*. Each of the second concave portions 181*b* and the second protruding portion 183*b* of the second uneven pattern portion 180*b* may be configured the same structure as each of the concave portions 181 and protruding portion 183 of the light extraction pattern 180 disposed at the light emission area EA of the pixel area PA, and thus, repetitive descriptions may be omitted or will be briefly given.

Some (or a portion) of the second uneven pattern portion 180*b* may be covered (or overlaid) by the adhesive member 200, but embodiments of the present disclosure are not limited thereto. The entire second uneven pattern portion 180*b* may be covered (or overlaid) by the adhesive member 200. For example, the adhesive member 200 may directly contact the second uneven pattern portion 180*b*.

According to an embodiment of the present disclosure, a pitch (or an interval) between the second concave portions 181*b* of the second uneven pattern portion 180*b* disposed at each of the second non-display area IA2 and the third non-display area IA3 may be the same as a pitch (or an interval) between the concave portions 181 of the light extraction pattern 180 disposed at the display area AA. According to an embodiment of the present disclosure, the number of second concave portions 181*b* per unit area in the second uneven pattern portion 180*b* disposed at each of the second non-display area IA2 and the third non-display area IA3 may be the same as the number of concave portions 181 per unit area in the light extraction pattern 180 disposed at the display area AA.

The second uneven pattern portion 180*b* may scatter external light which is incident through the second non-display area IA2 and the third non-display area IA3. For example, some of the light which is incident on the second non-display area IA2 and the third non-display area IA3 may be scattered at the second uneven pattern portion 180*b* through the gate driving circuits 55 and 57 of the peripheral circuit portion 50 disposed at each of the second non-display area IA2 and the third non-display area IA3 of the substrate 100. Some of the light scattered by the second uneven pattern portion 180*b* may again pass through the gate driving circuits 55 and 57, and then may be emitted again to the external (or outside) through the substrate 100. Thus, according as third light reflected by the gate driving circuits 55 and 57 is mixed with fourth light scattered by the second uneven pattern portion 180*b*, visibility of the third light may be reduced or minimized, and the gate driving circuits 55 and 57 of the peripheral circuit portion 50 may be not visible due to a haze or blurring of the third light. According to an embodiment of the present disclosure, when the external light is incident on the second non-display area IA2 and the third non-display area IA3 of the substrate 100, each of the second non-display area IA2 and the third non-display area IA3 may have a constant haze value by the mixture of the third light and the fourth light.

The second uneven pattern portion 180*b* may be further provided at the second extending portion 170*b* and the third extending portion 170*c* of the planarization layer 170 disposed at each of the second non-display area IA2 and the third non-display area IA3 of the substrate 100 as well as some portions of the planarization layer 170 of the outermost pixel area PA adjacent to each of the second non-display area IA2 and the third non-display area IA3.

In the light emitting display apparatus including the second uneven pattern portion 180*b*, each of the second non-display area IA2 and the third non-display area IA3 of the substrate 100 is blurred due to the scattering of the external light by the second uneven pattern portion 180*b*, whereby visibility of the peripheral circuit portion 50 disposed at each of the second non-display area IA2 and the third non-display area IA3 may be minimized or reduced. Thus, when the display panel 10 is in a turn-off state or a black image is displayed at the display panel 10, a color difference (or a difference in an impression of color) between each of the second non-display area IA2 and the third non-display area IA3 and the display area AA caused by a reflection of external light due to the peripheral circuit portion 50 disposed at each of the second non-display area IA2 and the third non-display area IA3 may be reduced or minimized by the uneven pattern portion (or the second uneven pattern portion 180*b*).

FIG. 7 is a cross-sectional view taken along III-III' shown in FIG. 1, which explains a third uneven pattern portion according to an embodiment of the present disclosure. Hereinafter, repetitive descriptions of the remaining portions except the third uneven pattern portion and related elements may be omitted or will be briefly given.

With reference to FIGS. 1 and 7, in the first substrate 100 or display panel 10 according to an embodiment of the present disclosure, the planarization layer 170 may include a fourth extending portion 170d which extends or expands from a fourth side AAd of the display area AA to the fourth non-display area IA4.

The fourth extending portion 170d may extend from the fourth side AAd of the display area AA to the end of the fourth non-display area IA4. For example, an end 170s4 of the fourth extending portion 170d (or fourth side of the planarization layer) may be positioned or aligned at the lateral surface of the substrate 100. For example, the fourth extending portion 170d may cover (or overlay) the entire fourth non-display area IA4.

The planarization layer 170 may further include an uneven pattern portion 180c disposed at the fourth extending portion 170d. For example, the uneven pattern portion 180c disposed at the fourth extending portion 170d of the planarization layer 170 may be the third uneven pattern portion 180c.

The third uneven pattern portion 180c may be provided at the entire planarization layer 170 disposed at the fourth non-display area IA4.

The third uneven pattern portion 180c may include a plurality of third concave portions 181c and a third protruding portion 183c disposed between the plurality of third concave portions 181c. Each of the third concave portions 181c and the third protruding portions 183c of the third uneven pattern portion 180c may be configured the same structure as the concave portions 181 and protruding portions 183 of the light extraction pattern 180 disposed at the light emission area EA of the pixel area PA, and thus, repetitive descriptions may be omitted or will be briefly given.

Some (or a portion) of the third uneven pattern portion 180c may be covered (or overlaid) by the adhesive member 200, but embodiments of the present disclosure are not limited thereto. The entire third uneven pattern portion 180c may be covered (or overlaid) by the adhesive member 200. For example, the adhesive member 200 may directly contact the third uneven pattern portion 180c.

According to an embodiment of the present disclosure, a pitch (or an interval) between the third concave portions 181c of the third uneven pattern portion 180c disposed at the fourth non-display area IA4 may be the same as a pitch (or an interval) between the concave portions 181 of the light extraction pattern 180 disposed at the display area AA. According to an embodiment of the present disclosure, the number of third concave portions 181c per unit area in the third uneven pattern portion 180c disposed at the fourth non-display area IA4 may be the same as the number of concave portions 181 per unit area in the light extraction pattern 180 disposed at the display area AA.

The third uneven pattern portion 180c may scatter external light which is incident through the fourth non-display area IA4 of the substrate 100. For example, some of the light which is incident on the fourth non-display area IA4 of the substrate 100 may be scattered at the third uneven pattern portion 180c through the test circuit portion 59 of the peripheral circuit portion 50 disposed at the fourth non-display area IA4 of the substrate 100. Some of the light scattered by the third uneven pattern portion 180c may again pass through the test circuit portion 59, and then may be emitted again to the external (or outside) through the substrate 100. Thus, according as fifth light reflected by the test circuit portion 59 is mixed with sixth light scattered by the third uneven pattern portion 180c, visibility of the fifth light may be reduced or minimized, and the test circuit portion 59 may be not visible due to a haze or blurring of the fifth light. According to an embodiment of the present disclosure, when the external light is incident on the fourth non-display area IA4 of the substrate 100, the fourth non-display area IA4 may have a constant haze value by the mixture of the fifth light and the sixth light.

The third uneven pattern portion 180c may be further provided at the fourth extending portion 170d of the planarization layer 170 disposed at the fourth non-display area IA4 of the substrate 100 as well as some portions of the planarization layer 170 of the outermost pixel area PA adjacent to the fourth non-display area IA4.

In the light emitting display apparatus including the third uneven pattern portion 180c, the fourth non-display area IA4 of the substrate 100 is blurred due to the scattering of the external light by the third uneven pattern portion 180c, whereby visibility of the peripheral circuit portion 50 disposed at the fourth non-display area IA4 may be minimized or reduced. Thus, when the display panel 10 is in a turn-off state or a black image is displayed at the display panel 10, a color difference (or a difference in an impression of color) between the fourth non-display area IA4 and the display area AA caused by a reflection of external light due to the peripheral circuit portion 50 disposed at the fourth non-display area IA4 may be reduced or minimized by the uneven pattern portion (or the third uneven pattern portion 180c).

Figure 8:
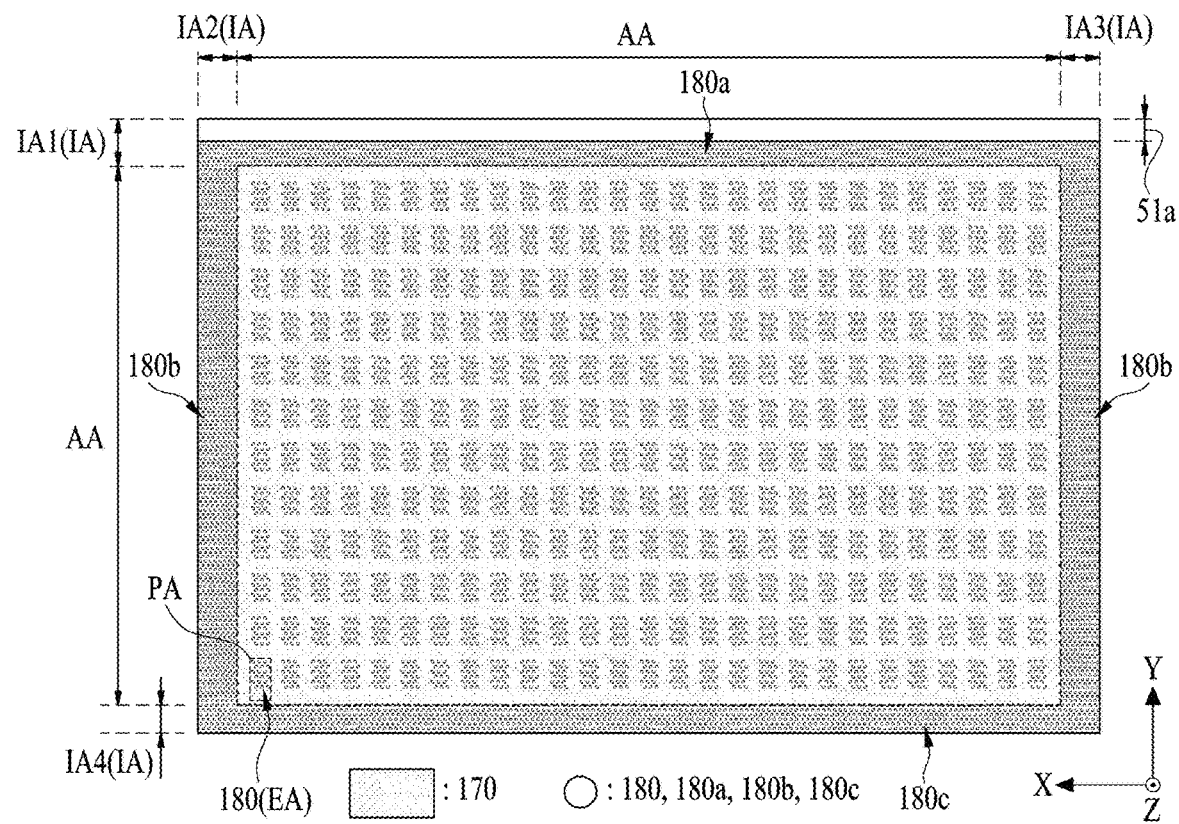
FIG. 8 illustrates a planarization layer according to another embodiment of the present disclosure.
Figure 9:
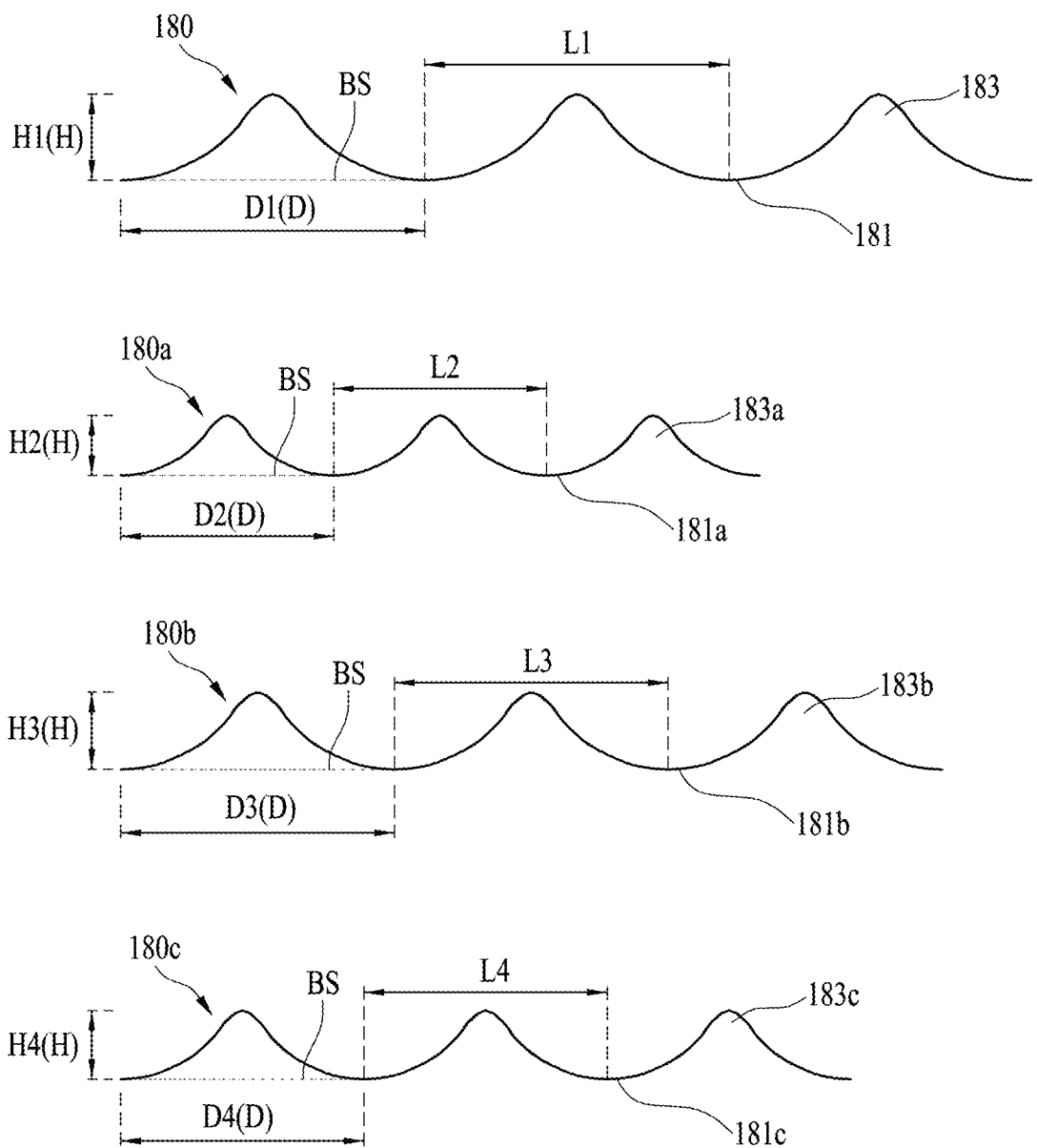
FIG. 9 illustrates a cross-sectional structure of a light extraction pattern and first to third uneven pattern portions shown in FIG. 8.

FIG. 8 illustrates a planarization layer according to another embodiment of the present disclosure. FIG. 9 illustrates a cross-sectional structure in each of a light extraction pattern and first to third uneven pattern portions shown in FIG. 8. Hereinafter, repetitive descriptions of elements other than a cross-sectional structure in each of the light extraction pattern and the first to third uneven pattern portions may be omitted or will be briefly given.

With reference to FIGS. 8 and 9, a planarization layer 170 according to another embodiment of the present disclosure may be disposed at a display area AA and a non-display area IA except a pad area 51a of a substrate 100.

The planarization layer 170 may include a light extraction pattern 180, and first to third uneven pattern portions 180a, 180b and 180c.

The light extraction pattern 180 and the first to third uneven pattern portions 180a, 180b and 180c may have the different sizes from each other. For example, each of the light extraction pattern 180 and the first to third uneven pattern portions 180a, 180b and 180c may be configured to have the different haze value for each corresponding area according to an area of a metal layer for reflecting external light in each corresponding area.

The light extraction pattern 180 may be disposed at the light emission area EA of each pixel area PA of the display area AA. The light extraction pattern 180 may include a plurality of concave portions 181 and a protruding portion 183 disposed between the plurality of concave portions 181.

The plurality of concave portions 181 may be spaced apart from each other. The plurality of concave portions 181 according to an embodiment of the present disclosure may be provided to be spaced apart from one another along each of the first direction X and the second direction Y. For example, two adjacent concave portions 181 may have a first interval L1 from each other. The first interval L1 may be a distance between central points of the two adjacent concave portions 181 along the first direction X or the second direction Y. For example, the first interval L1 between the two adjacent concave portions 181 or the first interval L1 between the plurality of concave portions 181 may be a pitch of the concave portion 181 or a pitch of the light extraction pattern 180.

The protruding portion 183 may be provided to surround each of the plurality of concave portions 181. For example, the protruding portion 183 may be convexly provided to have a first diameter D1 and a first height H1. The protruding portion 183 according to an embodiment of the present disclosure may include a bottom surface BS, a top portion, and a curved-surface portion between the bottom surface BS and the top portion. For example, the protruding portion 183 may have a cross-sectional structure of Gaussian curve or may have a sharp cross-sectional structure at the top portion. For example, the top portion of the protruding portion 183 may have a sharp tip.

An emission efficiency of a light emitting portion may be determined based on a shape of the protruding portion 183. A light extraction efficiency may be determined based on a shape of the protruding portion 183 of the light extraction pattern 180 and a shape of the light emitting device layer EDL.

The protruding portion 183 may have a tangential inclination which is gradually decreased from the top portion to the bottom surface BS. For example, the tangential inclination may be defined by an angle between the curved portion and a horizontal line parallel to the bottom surface BS of the protruding portion 183.

The protruding portion 183 may have a maximum tangent slope between a half height H/2 and the top portion. For example, the protruding portion 183 may include a first tangent slope at a half height H/2, and a second tangent slope at a 4/5 height. The second tangent slope may be greater than the first tangent slope such that light emitted from the light emitting device layer EDL is not trapped in the light emitting element ED but is extracted to the outside as much as possible.

The first uneven pattern portion 180a may be disposed at the remaining portions except the pad area 51a among the first non-display area IA1. The first uneven pattern portion 180a may include a plurality of first concave portions 181a and a first protruding portions 183a disposed between the plurality of first concave portions 181a.

The plurality of first concave portions 181a may be spaced apart from each other. The plurality of first concave portions 181a according to an embodiment of the present disclosure may be provided to be spaced apart from one another along each of the first direction X and the second direction Y. For example, two adjacent first concave portions 181a may have a second interval L2 from each other. The second interval L2 may be a distance between central points of the two adjacent first concave portions 181a along the first direction X or the second direction Y. For example, the second interval L2 between the two adjacent first concave portions 181a or the second interval L2 between the plurality of first concave portions 181a may be a pitch of the first concave portion 181a or a pitch of the first uneven pattern portion 180a.

According to an embodiment of the present disclosure, the second interval L2 between the two adjacent first concave portions 181a may be narrower or smaller than the first interval L1 between the two adjacent concave portions 181 disposed at the display area AA. For example, the pitch L2 of the first concave portion 181a may be smaller than the pitch L1 of the concave portion 181. According to an embodiment of the present disclosure, the number of first concave portions 181a per unit area in the first uneven pattern portion 180a disposed at the first non-display area IA1 may be larger than the number of concave portions 181 per unit area in the light extraction pattern 180 disposed at the display area AA.

The first protruding portion 183a may be provided to surround each of the plurality of first concave portions 181a. For example, the first protruding portion 183a may be convexly provided to have a second diameter D2 and a second height H2. The first protruding portion 183a according to an embodiment of the present disclosure may include a bottom surface BS, a top portion, and a curved-surface portion between the bottom surface BS and the top portion. For example, the first protruding portion 183a may have a cross-sectional structure of Gaussian curve or may have a sharp cross-sectional structure at the top portion. For example, the top portion of the first protruding portion 183a may have a sharp tip. For example, the second diameter D2 may be smaller than the first diameter D1. For example, the second height H2 may be the same as or smaller than the first height H1.

The second uneven pattern portion 180b may be disposed at each of the second non-display area IA2 and the third non-display area IA3. The second uneven pattern portion 180b may include a plurality of second concave portions 181b and a second protruding portion 183b disposed between the plurality of second concave portions 181b.

The plurality of second concave portions 181b may be spaced apart from each other. The plurality of second concave portions 181b according to an embodiment of the present disclosure may be provided to be spaced apart from one another along each of the first direction X and the second direction Y. For example, two adjacent second concave portions 181b have a third interval L3 from each other. The third interval L3 may be a distance between central points of the two adjacent second concave portions 181b along the first direction X or the second direction Y. For example, the third interval L3 between the two adjacent second concave portions 181b or the third interval L3 between the plurality of second concave portions 181b may be a pitch of the second concave portion 181b or a pitch of the second uneven pattern portion 180b.

According to an embodiment of the present disclosure, the third interval L3 between the two adjacent second concave portions 181b may be narrower or smaller than the first interval L1 between the two adjacent concave portions 181 disposed at the display area AA. For example, the pitch L3 of the second concave portion 181b may be smaller than the pitch L1 of the concave portion 181, and may be larger than the pitch L2 of the first concave portion 181a. According to an embodiment of the present disclosure, the number of first concave portions 181a per unit area in the first uneven pattern portion 180a disposed at the first non-display area IA1 may be larger than the number of second concave portions 181b per unit area in the second uneven pattern portion 180b disposed at each of the second non-display area IA2 and the third non-display area IA3. According to an embodiment of the present disclosure, the number of second concave portions 181b per unit area in the second uneven pattern portion 180b may be larger than the number of concave portions 181 per unit area in the light extraction pattern 180 disposed at the display area AA.

The second protruding portion 183b may be provided to surround each of the plurality of second concave portions 181b. For example, the second protruding portion 183b may be convexly provided to have a third diameter D3 and a third height H3. The second protruding portion 183b according to an embodiment of the present disclosure may include a bottom surface BS, a top portion, and a curved-surface portion between the bottom surface BS and the top portion. For example, the second protruding portion 183b may have a cross-sectional structure of Gaussian curve or may have a sharp cross-sectional structure at the top portion. For example, the top portion may have a sharp tip. For example, the third diameter D3 may be smaller than the first diameter D1, and may be the same as or smaller than the second diameter D2. For example, the third height H3 may be the same as or smaller than the first height H1, and may be the same as or smaller than the second height H2.

The third uneven pattern portion 180c may be disposed at the fourth non-display area IA4. The third uneven pattern portion 180c may include a plurality of third concave portions 181c and a third protruding portion 183c disposed between the plurality of third concave portions 181c.

The plurality of third concave portions 181c may be spaced apart from each other. The plurality of third concave portions 181c according to an embodiment of the present disclosure may be provided to be spaced apart from one another along the first direction X and the second direction Y. For example, two adjacent third concave portions 181c have a fourth interval L4 from each other. The fourth interval L4 may be a distance between central points of the two adjacent third concave portions 181c along the first direction X or the second direction Y. For example, the fourth interval L4 between the two adjacent third concave portions 181c or the fourth interval L4 between the plurality of third concave portions 181c may be a pitch of the third concave portion 181c or a pitch of the third uneven pattern portion 180c.

According to an embodiment of the present disclosure, the fourth interval L4 between the two adjacent third concave portions 181c may be narrower or smaller than the first interval L1 between the two adjacent concave portions 181 disposed at the display area AA. For example, the pitch L4 of the third concave portion 181c may be smaller than each of the pitch L1 of the concave portion 181 and the pitch L3 of the second concave portion 181b, and may be larger than the pitch L2 of the first concave portion 181a. According to an embodiment of the present disclosure, the number of first concave portions 181a per unit area in the first uneven pattern portion 180a disposed at the first non-display area IA1 may be larger than the number of third concave portions 181c per unit area in the third uneven pattern portion 180c disposed at the fourth non-display area IA4. According to an embodiment of the present disclosure, the number of third concave portions 181c per unit area in the third uneven pattern portion 180c disposed at the fourth non-display area IA4 may be larger than the number of second concave portions 181b per unit area in the second uneven pattern portion 180b disposed at each of the second non-display area IA2 and the third non-display area IA3, and may be larger than the number of concave portions 181 per unit area in the light extraction pattern 180 disposed at the display area AA.

The third protruding portion 183c may be provided to surround each of the plurality of third concave portions 181c. For example, the third protruding portion 183c may be convexly provided to have a fourth diameter D4 and a fourth height H4. The third protruding portion 183c according to an embodiment of the present disclosure may include a bottom surface BS, a top portion, and a curved-surface portion between the bottom surface BS and the top portion. For example, the third protruding portion 183c may have a cross-sectional structure of Gaussian curve or may have a sharp cross-sectional structure at the top portion. For example, the top portion of the third protruding portion 183c may have a sharp tip. For example, the fourth diameter D4 may be smaller than the first diameter D1, may be the same as or smaller than the second diameter D2, and may be the same as or smaller than the third diameter D3. For example, the fourth height H4 may be the same as or smaller than the first height H1, may be the same as or smaller than the second height H2, and may be the same as or smaller than the third height H3.

Each of the first to third uneven pattern portions 180a, 180b and 180c disposed at each of the first to fourth non-display areas IA1, IA2, IA3, and IA4 scatter external light which is incident through the substrate 100 and the peripheral circuit portion, whereby visibility of the peripheral circuit portion 50 disposed at the first to fourth non-display areas IA1, IA2, IA3, and IA4 may be minimized or reduced. Thus, when the display panel 10 is turned-off or a black image is displayed at the display panel 10, it is possible to reduce or minimize a color difference (or a difference in an impression of color) between the display area AA and each of the first to fourth non-display areas IA1, IA2, IA3, and IA4. For example, the haze characteristics (or the blurring characteristics) of the non-display area IA by the first to third uneven pattern portions 180a, 180b and 180c disposed at the non-display area IA may be the same as or similar to the haze characteristics of the display area AA according to the scattering of the external light by the light extraction pattern 180 disposed at the display area AA, and thus, a color difference (or a difference in an impression of color) between the fourth non-display area IA4 and the display area AA may be reduced or minimized.

Figure 10:
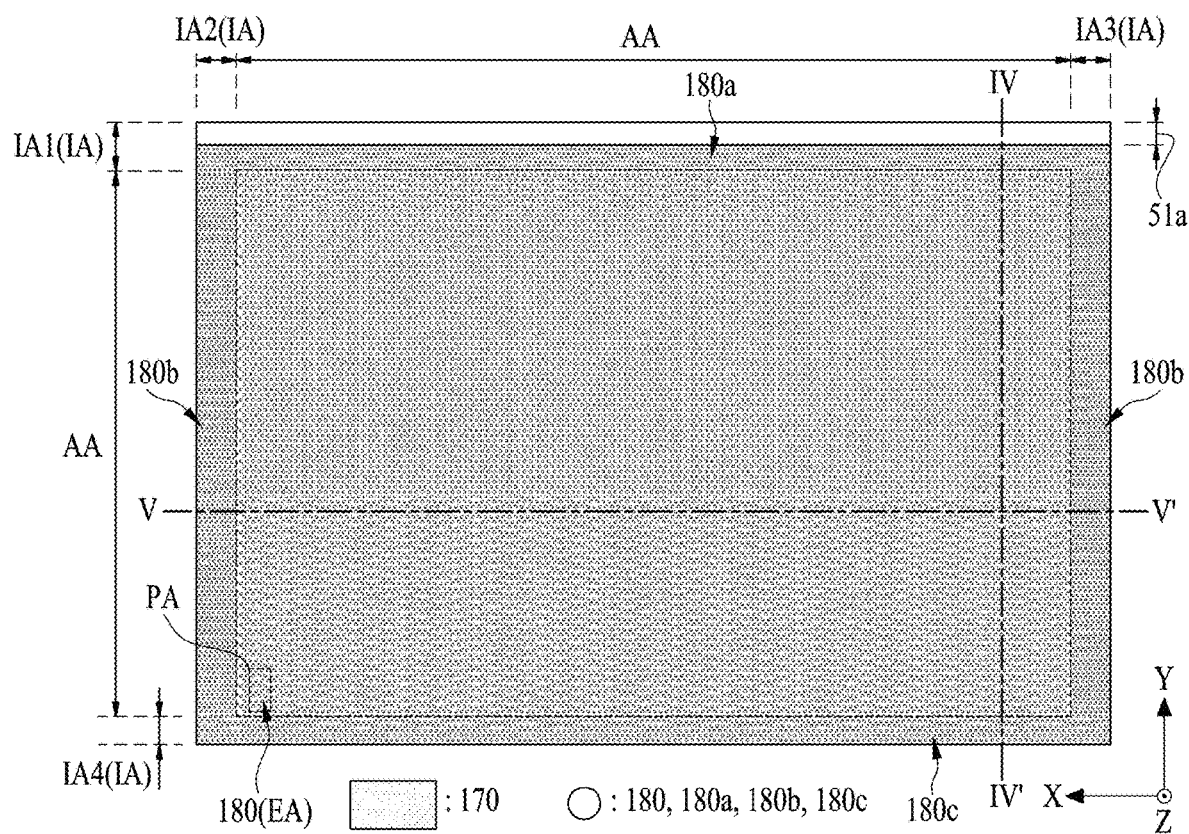
FIG. 10 illustrates a planarization layer according to another embodiment of the present disclosure.
Figure 11:
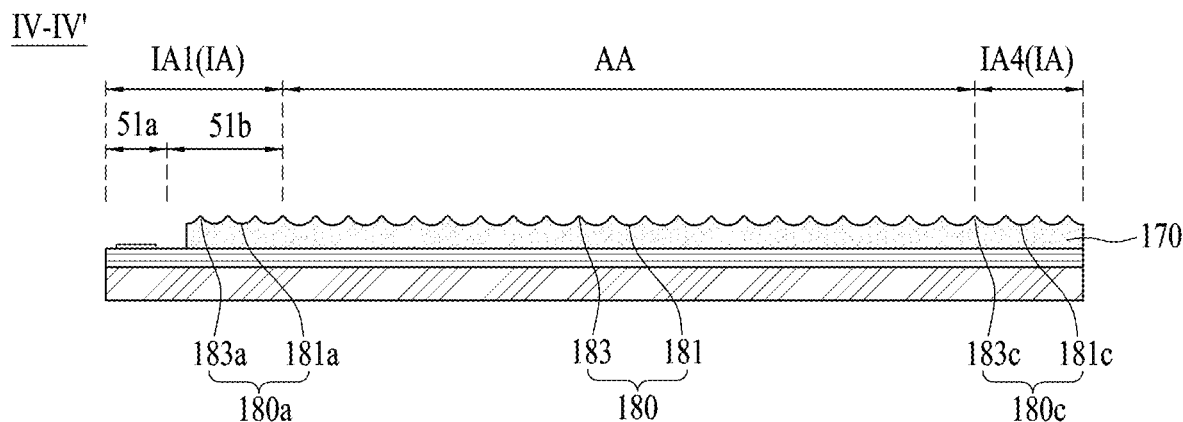
FIG. 11 is a cross-sectional view taken along IV-IV' of FIG. 10.
Figure 12:
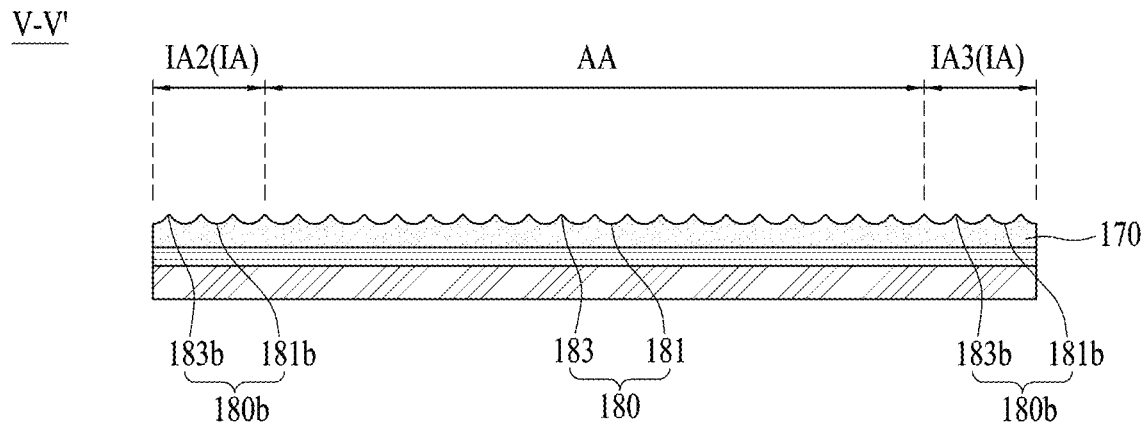
FIG. 12 is a cross-sectional view taken along V-V' of FIG. 10.

FIG. 10 illustrates a planarization layer according to another embodiment of the present disclosure. FIG. 11 is a cross-sectional view taken along IV-IV' of FIG. 10. FIG. 12 is a cross-sectional view taken along V-V' of FIG. 10, which shows a light extraction pattern provided at an entire area of a planarization layer of a display area shown in FIG. 10. Hereinafter, a description for first to third uneven pattern portions other than the light extraction pattern is the same as the description related with FIGS. 8 and 9, repetitive descriptions for the first to third uneven pattern portions may be omitted or will be briefly given.

With reference to FIGS. 10 to 12, a light extraction pattern 180 according to another embodiment of the present disclosure may be disposed at an entire upper surface of a planarization layer 170 disposed at a display area AA. For example, the light extraction pattern 180 according to another embodiment of the present disclosure may be disposed at a light emission area EA of each pixel area PA and further disposed at a circuit area. Accordingly, the entire upper surface of the planarization layer 170 disposed at a substrate 100 may be provided with the light extraction pattern 180 and an uneven pattern portion having uneven pattern portions 180a, 180b and 180c.

As an embodiment, the light extraction pattern 180 may include a plurality of concave portions 181 and protruding portion 183 disposed at the entire upper surface of the planarization layer 170 disposed at the display area AA. The first uneven pattern portion 180a may include a plurality of first concave portions 181a and first protruding portion 183a disposed at the entire upper surface of the planarization layer 170 corresponding to the remaining first non-display area IA except a pad area 51a of the first non-display area IA. The second uneven pattern portion 180b may include a plurality of second concave portions 181b and second protruding portion 183b disposed at the entire upper surface of the planarization layer 170 corresponding to second and third non-display areas IA2 and IA3. The third uneven pattern portion 180c may include a plurality of third concave portions 181c and third protruding portion 183c disposed at the entire upper surface of the planarization layer 170 corresponding to a fourth non-display area IA4.

Accordingly, the light extraction pattern 180 disposed at the entire surface of the display area AA scatters external light which is incident on the display area AA, and thus more uniformly provides the haze characteristics (or the blurring characteristics) to the entire area of the display area AA, whereby a color difference (or a difference in an impression of color) per each area inside the display area AA caused according to a reflection of the external light at the display area AA may be reduced or minimized. Also, each of the first to third uneven pattern portions 180a, 180b and 180c disposed at each of the first to fourth non-display areas IA1, IA2, IA3, and IA4 scatter external light which is incident through the substrate 100 and the peripheral circuit portion, whereby visibility of the peripheral circuit portion 50 disposed at the first to fourth non-display areas IA1, IA2, IA3, and IA4 may be minimized or reduced. Thus, when the display panel 10 is turned-off or a black image is displayed at the display panel 10, a color difference (or a difference in an impression of color) between the display area AA and each of the first to fourth non-display areas IA1, IA2, IA3, and IA4 may be minimized or reduced. For example, the haze characteristics of the non-display area IA according to the light scattered by the first to third uneven pattern portions 180a, 180b and 180c disposed at the non-display area IA may be the same as or similar to the haze characteristics of the display area AA according to the light scattered by the light extraction pattern 180 disposed at the display area AA, whereby a color difference (or a difference in an impression of color) between the display area AA and the non-display areas IA may be minimized or reduced.

Figure 13:
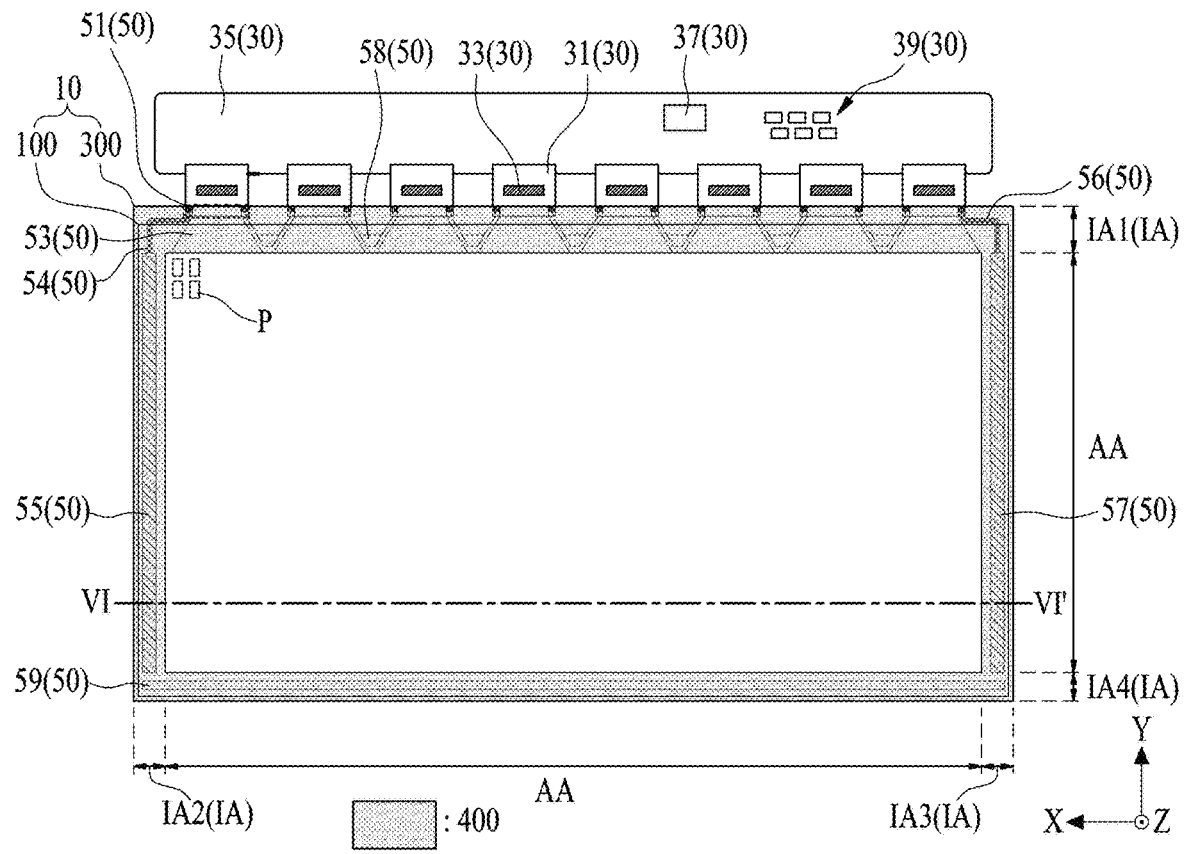
FIG. 13 illustrates a light emitting display apparatus according to another embodiment of the present disclosure.
Figure 14:
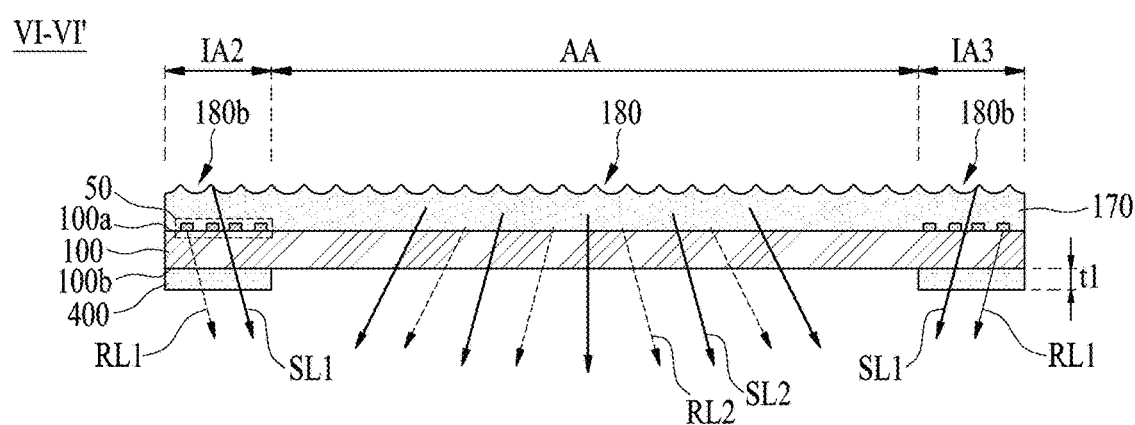
FIG. 14 is a schematic cross-sectional view taken along VI-VI' of FIG. 13.

FIG. 13 illustrates a light emitting display apparatus according to another embodiment of the present disclosure, and FIG. 14 is a cross-sectional view taken along VI-VI' of FIG. 13, wherein the light emitting display apparatus of FIGS. 13 and 14 is obtained by additionally providing an edge pattern layer in the light emitting display apparatus of FIGS. 1 to 12. Hereinafter, repetitive descriptions of the remaining elements except the edge pattern layer and related elements may be omitted or will be briefly given.

With reference to FIGS. 13 and 14 in connection with FIG. 8 or 10, in the light emitting display apparatus according to another embodiment of the present disclosure, an edge pattern layer 400 may be disposed at the edge of a second surface (or light extraction surface) 100b which is opposite to a first surface (or front surface) 100a of a substrate 100. The edge pattern layer 400 may be disposed along the edge of the second surface 100b of the substrate 100 to overlap with each of first to fourth non-display areas IA1, IA2, IA3, and IA4 of the substrate 100. The edge pattern layer 400 according to an embodiment of the present disclosure may be overlapped with at least a portion or the entire first to fourth non-display areas IA1, IA2, IA3, and IA4, respectively. For example, the edge pattern layer 400 may be configured to cover (or overlay) all area between the end of the display area AA and the end of the substrate 100.

The edge pattern layer 400 may be overlapped with at least a portion of uneven pattern portions 180a, 180b, 180c disposed at each of the first to fourth non-display areas IAL IA2, IA3, and IA4 of the substrate 100.

The edge pattern layer 400 according to an embodiment of the present disclosure may include a light absorbent material. For example, the edge pattern layer 400 may be formed of a black material such as a black ink. The edge pattern layer 400 is made of a black material and is formed at a thickness t1 of 1.0 to 1.5 µm, to thereby realize the semi-transparent characteristics.

According to an embodiment of the present disclosure, when the edge pattern layer 400 is made of a black material and has a thickness t1 exceeding 1.5 µm, the edge pattern layer 400 may be opaque due to a relatively large thickness. When the edge pattern layer 400 has a thickness causing an opaqueness, the first to fourth non-display areas IAL IA2, IA3, and IA4 display a black color due to a block-out of external light which is incident on a peripheral circuit portion 50, whereby it has a problem related with a color difference (or a difference in an impression of color) between the display area AA and the non-display area IA.

According to an embodiment of the present disclosure, when the edge pattern layer 400 is made of a black material and has a thickness t1 less than 1.0 µm, the edge pattern layer 400 may be transparent due to a relatively small thickness. When the edge pattern layer 400 has a thickness causing a transparency, reflected light RL1 reflected by the peripheral circuit portion 50 passes through the edge pattern layer 400, whereby it has a problem related with a visibility of the peripheral circuit portion 50.

Accordingly, the edge pattern layer 400 is made of a black material and has a thickness t1 of 1.0 to 1.5 µm, whereby visibility of the peripheral circuit portion 50 caused by the external light may be reduced, and thus a color difference (or a difference in an impression of color) between the display area AA and the non-display area IA may be minimized.

The edge pattern layer 400 absorbs or blocks some of the external light which is incident on the peripheral circuit portion 50 disposed at each of the first to fourth non-display areas IAL IA2, IA3, and IA4, and may absorb at least some of the reflected light RL1 reflected by the peripheral circuit portion 50. Thus, the edge pattern layer 400 may reduce or minimize a visibility of the peripheral circuit portion 50 by a light reflection of a metal layer disposed at the peripheral circuit portion 50. Also, the edge pattern layer 400 may transmit the scattered light SL1 which is scattered by the uneven pattern portion and is then incident through the substrate 100. Accordingly, the scattered light SL1 passing through the edge pattern layer 400 blurs the reflected light RL1 which is reflected by the peripheral circuit portion 50 and then passes through the edge pattern layer 400 so that it is possible to reduce or minimize a visibility of the peripheral circuit portion 50, and to reduce or minimize a color difference (or a difference in an impression of color) between the display area AA and the non-display area IA of the substrate 100. Thus, when a display panel 10 is turned-off or a black image is displayed at the display panel 10, a color difference (or a difference in an impression of color) between the display area AA and each of the first to fourth non-display areas IAL IA2, IA3, and IA4 may be reduced or minimized. For example, the haze characteristics of the non-display area IA according to the reflected light RL1 caused by the peripheral circuit portion 50 and the scattered light SL1 caused by the first to third uneven pattern portions 180a, 180b and 180c disposed at the non-display area IA may be the same as or similar to the haze characteristics of the display area AA according to reflected light RL2 caused by signal lines and scattered light SL2 caused by the light extraction pattern 180 disposed at the display area AA.

Additionally, the edge pattern layer 400 may be disposed between the substrate 100 and an optical film. For example, the optical film may be a polarizing film. The optical film may be attached to the entire second surface 100b of the substrate 100 including the edge pattern layer 400 by a film laminating process using an adhesive.

Figure 15A:
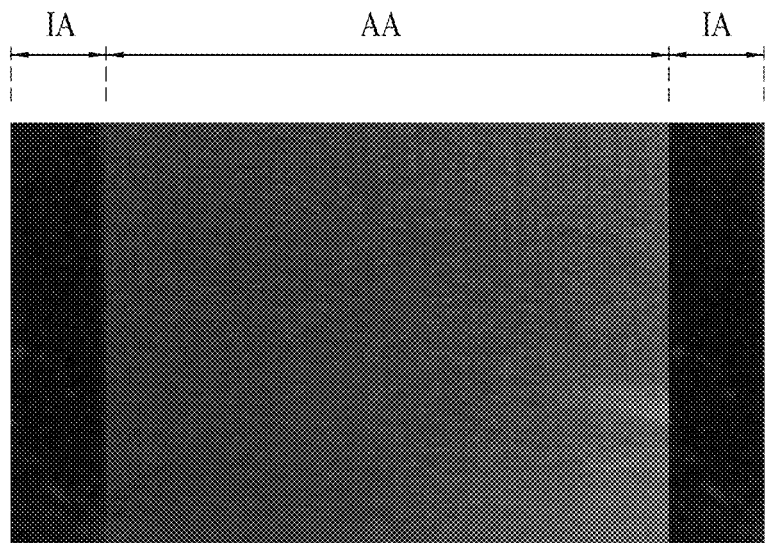
FIG. 15A illustrates a color difference (or a difference in an impression of color) between a non-display area and a display area in a related art light emitting display apparatus.
Figure 15B:
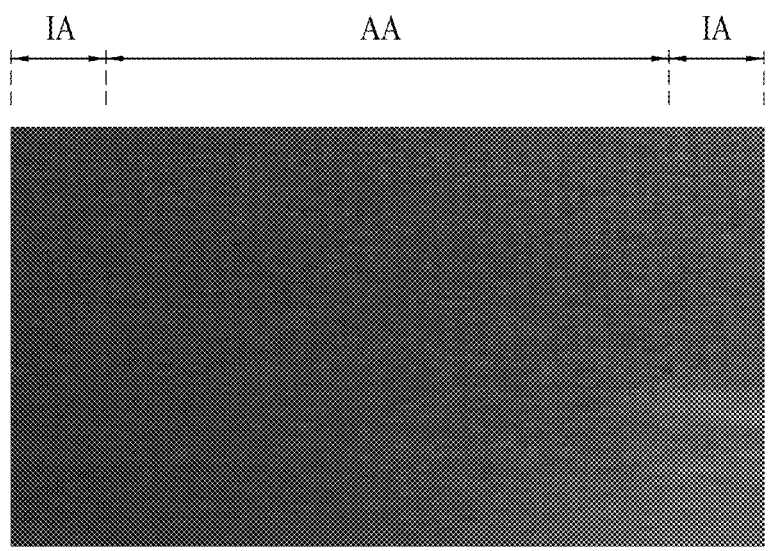
FIG. 15B illustrates a color difference (or a difference in an impression of color) between a non-display area and a display area in the light emitting display apparatus according to an embodiment of the present disclosure.

FIG. 15A illustrates a color difference (or a difference in an impression of color) between the non-display area and the display area in the related art light emitting display apparatus. FIG. 15B illustrates a color difference (or a difference in an impression of color) between the non-display area and the display area in the light emitting display apparatus according to an embodiment of the present disclosure. The related art light emitting display apparatus shown in FIG. 15A includes a black edge pattern disposed at the non-display area, and the light emitting display apparatus according to an embodiment of the present disclosure includes the edge pattern layer disposed at the non-display area.

As shown in FIG. 15A, according as the related art light emitting display apparatus includes the black edge pattern disposed at the non-display area IA, the black edge pattern is shown as a black color, whereby the color difference between the non-display area IA and the display area AA is clearly visible.

Meanwhile, as shown in FIG. 15B, according as the light emitting display apparatus according to an embodiment of the present disclosure includes the uneven pattern portion disposed at the non-display area IA and the semi-transparent edge pattern layer, the non-display area IA is shown as a non-black color owing to the scattered light caused by the uneven pattern portion, whereby it is possible to reduce or minimize the color difference between the non-display area IA and the display area AA. Also, in case of the light emitting display apparatus according to an embodiment of the present disclosure, when the display panel is turned-off or the black image is displayed at the display panel, the haze characteristics between the non-display area IA and the display area AA become similar owing to the scattered light by the light extraction pattern disposed at the display area AA and the scattered light by the uneven pattern portion disposed at the non-display area IA so that it is possible to reduce or minimize the color difference between the non-display area IA and the display area AA.

The light emitting display apparatus according to an embodiment of the present disclosure will be described below.

According to an embodiment of the present disclosure, a light emitting display apparatus may include a substrate configured to include a display area with a plurality of pixel areas, and a non-display area surrounding the display area, and a planarization layer disposed at the display area and partially at the non-display area, the planarization layer may be configured to include an uneven pattern portion disposed at the non-display area, and the uneven pattern portion may be configured to include a plurality of concave portions.

According to some embodiment of the present disclosure, the non-display area may include a pad area and the planarization layer may be disposed at the remaining non-display area except the pad area among the non-display area, and/or the planarization layer is only partially disposed at the non-display area, and/or the non-display area includes a pad area and the planarization layer is not disposed at the pad area, and/or the uneven pattern portion includes protruding portions disposed between the plurality of concave portions and/or has an undulated shape.

According to some embodiment of the present disclosure, the uneven pattern portion may surround the display area, the non-display area may include first to fourth non-display areas to surround the display area, and the uneven pattern portion may be disposed at each of the first to fourth non-display areas.

According to some embodiment of the present disclosure, the number of concave portions per unit area in the uneven pattern portion disposed at each of the first to fourth non-display areas may be the same as or different from each other.

According to some embodiment of the present disclosure, a distance between central points of the two adjacent concave portions in the uneven pattern portion disposed at each of the first to fourth non-display areas may be the same as or different from each other.

According to some embodiment of the present disclosure, the non-display area may include a first non-display area disposed at the first side of the display area and configured to include the pad area, a second non-display area disposed at the second side of the display area, a third non-display area disposed at the third side which is parallel to the second side of the display area, and a fourth non-display area disposed at the fourth side which is parallel to the first side of the display area.

According to some embodiment of the present disclosure, the light emitting display apparatus may further include a plurality of gate lines disposed at the display area; and a gate driving circuit disposed at one or more among the second non-display area and the third non-display area and respectively connected with the plurality of gate lines.

According to some embodiment of the present disclosure, the first non-display area may further include a link area between the pad area and the display area. The uneven pattern portion disposed at the first non-display area may be disposed at the link area.

According to some embodiment of the present disclosure, the uneven pattern portion may include a first uneven pattern portion disposed at the first non-display area; a second uneven pattern portion disposed at each of the second non-display area and the third non-display area; and a third uneven pattern portion disposed at the fourth non-display area. The number of concave portions per unit area of the first uneven pattern portion may be larger than the number of concave portions per unit area of each of the second uneven pattern portion and the third uneven pattern portion.

According to some embodiment of the present disclosure, the number of concave portions per unit area of the third uneven pattern portion may be larger than the number of concave portions per unit area of the second uneven pattern portion.

According to some embodiment of the present disclosure, the uneven pattern portion may include a first uneven pattern portion disposed at the first non-display area; a second uneven pattern portion disposed at each of the second non-display area and the third non-display area; and a third uneven pattern portion disposed at the fourth non-display area. A pitch between central points of two adjacent concave portions disposed at the first uneven pattern portion may be smaller than a pitch between central points of two adjacent concave portions disposed at each of the second uneven pattern portion and the third uneven pattern portion.

According to some embodiment of the present disclosure, a pitch between central points of the two adjacent concave portions disposed at the third uneven pattern portion may be smaller than a pitch between central points of the two adjacent concave portions disposed at the second uneven pattern portion.

According to some embodiment of the present disclosure, the light emitting display apparatus may further include a peripheral circuit portion over the substrate of the non-display area, the uneven pattern portion may be disposed at the peripheral circuit portion.

According to some embodiment of the present disclosure, the display area may be configured to include a pixel array including a pixel disposed at each of the plurality of pixel areas, the pixel may be configured to include a light emitting portion, and a non-light emitting portion to surround the light emitting portion, and the planarization layer disposed at the light emitting portion may be configured to include a light extraction pattern including a plurality of concave portions and protruding portion surrounding each of the plurality of concave portions.

According to some embodiment of the present disclosure, the light emitting portion may include a non-planar portion including a plurality of concave portions and protruding portion between each of the plurality of concave portions, and each of the plurality of concave portions of the non-planar portion may be overlapped with each of the plurality of concave portions of the light extraction pattern, and the protruding portion of the non-planar portion may be overlapped with at least a portion of the protruding portion of the light extraction pattern.

According to some embodiment of the present disclosure, the planarization layer disposed at the non-light emitting portion may be configured to include a light extraction pattern including a plurality of concave portions and protruding portion surrounding each of the plurality of concave portions.

According to some embodiment of the present disclosure, the light emitting display apparatus may include a substrate configured to include a display area having a plurality of pixel areas and a non-display area surrounding the display area; a pixel circuit portion at the display area of the substrate; a peripheral circuit portion at the non-display area of the substrate; a planarization layer at the pixel circuit portion and the peripheral circuit portion; and a light emitting portion over the planarization layer of each of the plurality of pixel areas. The planarization layer at the peripheral circuit portion may include an uneven pattern portion, and the uneven pattern portion may be configured to include a plurality of concave portions and protruding portion disposed between the plurality of concave portions.

According to some embodiment of the present disclosure, the peripheral circuit portion may include a plurality of pad portions disposed at a pad area of a first non-display area adjacent to a first side of the display area; a link portion between each of the plurality of pad portions and the first side of the display area; a first gate driving circuit disposed at a second non-display area adjacent to a second side of the display area; and a second gate driving circuit disposed at a third non-display area adjacent to a third side of the display area in parallel with the second side of the display area. The planarization layer may be configured to be disposed at the remaining portions except the pad portion and some of the link portion adjacent to the pad portion among the peripheral circuit portion.

According to some embodiment of the present disclosure, the planarization layer may have a larger size than the display area, and/or wherein the area of the planarization layer may be larger than the area of the display area.

According to some embodiment of the present disclosure, the light emitting display apparatus may further include an opposite substrate disposed at the remaining portions except an edge portion of the substrate, and an adhesive member interposed between the substrate and the opposite substrate.

According to some embodiment of the present disclosure, an edge portion of the adhesive member may directly contact the uneven pattern portion of the planarization layer disposed at the non-display area.

According to some embodiment of the present disclosure, the light emitting display apparatus may further include an edge pattern layer disposed along an edge portion of the substrate overlapped with at least a portion of the uneven pattern portion, The uneven pattern portion may be disposed at a first surface of the substrate. The edge pattern layer may be disposed at a second surface opposite to the first surface of the substrate.

According to some embodiment of the present disclosure, the edge pattern layer has a thickness of 1.0 to 1.5 μm.

According to some embodiment of the present disclosure, the light emitting display apparatus may further include a color filter disposed between the planarization layer and the substrate overlapped with at least some of the plurality of pixel areas.

According to some embodiment of the present disclosure, the non-display area may include a pad area. The uneven pattern portion may include a first uneven pattern portion disposed at a first non-display area corresponding to a first side of the display area including the pad area, a second uneven pattern portion disposed at each of a second non-display area corresponding to a second side of the display area and a third non-display area corresponding to a third side of the display area, wherein the third side of the display area may be parallel to the second side of the display area, and a third uneven pattern portion disposed at a fourth non-display area corresponding to a fourth side of the display area, wherein the fourth side of the display area may be parallel to the first side of the display area. The number of concave portions per unit area of the first uneven pattern portion may be larger than the number of concave portions per unit area of each of the second uneven pattern portion and the third uneven pattern portion.

According to some embodiment of the present disclosure, the number of concave portions per unit area of the third uneven pattern portion may be larger than the number of concave portions per unit area of the second uneven pattern portion.

According to some embodiment of the present disclosure, the non-display area may include a pad area, and the uneven pattern portion may include a first uneven pattern portion disposed at a first non-display area corresponding to a first side of the display area including the pad area, a second uneven pattern portion disposed at each of a second non-display area corresponding to a second side of the display area and a third non-display area at a third side of the display area, wherein the third side of the display area may be parallel to the second side of the display area, and a third uneven pattern portion disposed at a fourth non-display area at a fourth side of the display area, wherein the fourth side of the display area may be parallel to the first side of the display area. A pitch between central points of two adjacent concave portions disposed at the first uneven pattern portion may be smaller than a pitch between central points of two adjacent concave portions disposed at each of the second uneven pattern portion and the third uneven pattern portion.

According to some embodiment of the present disclosure, a pitch between central points of the two adjacent concave portions disposed at the third uneven pattern portion may be smaller than a pitch between central points of the two adjacent concave portions disposed at the second uneven pattern portion.

According to some embodiment of the present disclosure, a light emitting display apparatus may include a substrate configured to include a display area with a plurality of pixel areas, and a non-display area surrounding the display area, and a planarization layer disposed at the display area and partially at the non-display area, the planarization layer may include a plurality of concave portions.

According to some n embodiment of the present disclosure, the non-display area may include a pad area and the planarization layer may be disposed at the remaining non-display area except the pad area among the non-display area, and/or the planarization layer is only partially disposed at the non-display area, and/or the non-display area includes a pad area and the planarization layer is not disposed at the pad area, and/or the uneven pattern portion includes protruding portions disposed between the plurality of concave portions and/or has an undulated shape.

According to some embodiment of the present disclosure, wherein a number of concave portions per unit area of the planarization layer disposed at the display area is the same as a number of concave portions per unit area of the planarization layer disposed at the remaining non-display area except the pad area among the non-display area; and/or wherein a pitch between central points of two adjacent concave portions of the planarization layer disposed at the display area is the same as a pitch between central points of two adjacent concave portions of the planarization layer disposed at the remaining non-display area except the pad area among the non-display area.

It will be apparent to those skilled in the art that various modifications and variations can be made in the light emitting display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display apparatus, comprising:
a substrate;
a display area with a plurality of pixel areas;
a non-display area surrounding the display area; and
a planarization layer disposed at the display area and partially at the non-display area,
wherein the planarization layer includes an uneven pattern portion disposed at the non-display area,
wherein the uneven pattern portion includes a plurality of concave portions,
wherein the display area includes a pixel array including a pixel disposed at each of the plurality of pixel areas,
wherein the pixel includes a light emitting portion, and a non-light emitting portion to surround the light emitting portion,
wherein the planarization layer disposed at the light emitting portion includes a light extraction pattern including a plurality of concave portions and a protruding portion surrounding each of the plurality of concave portions of the light emitting portion, and
wherein the planarization layer disposed at the non-light emitting portion includes a light extraction pattern including a plurality of concave portions and a protruding portion surrounding each of the plurality of concave portions of the non-light emitting portion.

2. The light emitting display apparatus of claim 1, wherein the non-display area includes a pad area, and the planarization layer is disposed at a remaining non-display area except the pad area of the non-display area;
wherein the planarization layer is only partially disposed at the non-display area;
wherein the non-display area includes the pad area, and the planarization layer is not disposed at the pad area; or
wherein the uneven pattern portion includes protruding portions disposed between the plurality of concave portions of the uneven pattern portion, or the uneven pattern portion has an undulated shape.

3. The light emitting display apparatus of claim 2, wherein the uneven pattern portion surrounds the display area,
wherein the non-display area includes first to fourth non-display areas to surround the display area, and
wherein the uneven pattern portion is disposed at each of the first to fourth non-display areas.

4. The light emitting display apparatus of claim 3, wherein the number of concave portions per unit area in the uneven pattern portion disposed at each of at least some of the first to fourth non-display areas are different from each other, or
wherein a distance between central points of two adjacent concave portions in the uneven pattern portion disposed at each of at least some of the first to fourth non-display areas are different from each other.

5. The light emitting display apparatus of claim 2, wherein the non-display area includes:
a first non-display area disposed at a first side of the display area and including the pad area;
a second non-display area disposed at a second side of the display area;
a third non-display area disposed at a third side which is parallel to the second side of the display area; and
a fourth non-display area disposed at a fourth side which is parallel to the first side of the display area.

6. The light emitting display apparatus of claim 5, further comprising:
a plurality of gate lines disposed at the display area; and
a gate driving circuit disposed at one or more among the second non-display area and the third non-display area and respectively connected with the plurality of gate lines, or
wherein the first non-display area further includes a link area between the pad area and the display area; and
wherein the uneven pattern portion disposed at the first non-display area is disposed at the link area.

7. The light emitting display apparatus of claim 5, wherein the uneven pattern portion includes:
a first uneven pattern portion disposed at the first non-display area;
a second uneven pattern portion disposed at each of the second non-display area and the third non-display area; and
a third uneven pattern portion disposed at the fourth non-display area,
wherein the number of concave portions per unit area of the first uneven pattern portion is larger than the number of concave portions per unit area of each of the second uneven pattern portion and the third uneven pattern portion.

8. The light emitting display apparatus of claim 7, wherein the number of concave portions per unit area of the third uneven pattern portion is larger than the number of concave portions per unit area of the second uneven pattern portion.

9. The light emitting display apparatus of claim 5, wherein the uneven pattern portion includes:
a first uneven pattern portion disposed at the first non-display area;
a second uneven pattern portion disposed at each of the second non-display area and the third non-display area; and
a third uneven pattern portion disposed at the fourth non-display area,
wherein a pitch between central points of two adjacent concave portions disposed at the first uneven pattern portion is smaller than a pitch between central points of two adjacent concave portions disposed at each of the second uneven pattern portion and the third uneven pattern portion.

10. The light emitting display apparatus of claim 9, wherein the pitch between the central points of the two adjacent concave portions disposed at the third uneven pattern portion is smaller than the pitch between the central points of the two adjacent concave portions disposed at the second uneven pattern portion.

11. The light emitting display apparatus of claim 1, further comprising a peripheral circuit portion over the substrate of the non-display area,
wherein the uneven pattern portion is disposed at the peripheral circuit portion.

12. The light emitting display apparatus of claim 1,
wherein the light emitting portion includes a non-planar portion including a plurality of concave portions and a protruding portion between each of the plurality of concave portions of the non-planar portion, and
wherein each of the plurality of concave portions of the non-planar portion is overlapped with each of the plurality of concave portions of the light extraction pattern of the light emitting portion, and the protruding portion of the non-planar portion is overlapped with at least a portion of the protruding portion of the light extraction pattern of the light emitting portion.

13. The light emitting display apparatus of claim 3, wherein the number of concave portions per unit area in the uneven pattern portion disposed at each of at least some of the first to fourth non-display areas is same as each other, or
wherein a distance between central points of two adjacent concave portions in the uneven pattern portion disposed at each of at least some of the first to fourth non-display areas is same as each other.

14. A light emitting display apparatus, comprising:
a substrate;
a display area having a plurality of pixel areas;
a non-display area surrounding the display area;
a pixel circuit portion at the display area;
a peripheral circuit portion at the non-display area;
a planarization layer at the pixel circuit portion and the peripheral circuit portion; and
a light emitting portion over the planarization layer of each of the plurality of pixel areas,
wherein the planarization layer at the peripheral circuit portion includes an uneven pattern portion,
wherein the uneven pattern portion includes a plurality of concave portions,
wherein the peripheral circuit portion includes:
a plurality of pad portions disposed at a pad area of a first non-display area adjacent to a first side of the display area;
a link portion between each of the plurality of pad portions and the first side of the display area;
a first gate driving circuit disposed at a second non-display area adjacent to a second side of the display area; and
a second gate driving circuit disposed at a third non-display area adjacent to a third side of the display area in parallel with the second side of the display area, and
wherein the planarization layer is disposed at remaining portions of the peripheral circuit portion except the plurality of pad portions and some of the link portions adjacent to the plurality of pad portions of the peripheral circuit portion.

15. The light emitting display apparatus of claim 14,
wherein the planarization layer has a larger size than the display area, or wherein a total area of the planarization layer is larger than a total area of the display area.

16. The light emitting display apparatus of claim 14, further comprising:
an opposite substrate disposed at remaining portions of the substrate except an edge portion of the substrate; and
an adhesive member interposed between the substrate and the opposite substrate.

17. The light emitting display apparatus of claim 16, wherein an edge portion of the adhesive member directly contacts the uneven pattern portion of the planarization layer disposed at the non-display area.

18. The light emitting display apparatus of claim 14, further comprising an edge pattern layer disposed along an edge portion of the substrate overlapped with at least a portion of the uneven pattern portion,
wherein the uneven pattern portion is disposed at a first surface of the substrate, and
wherein the edge pattern layer is disposed at a second surface opposite to the first surface of the substrate.

19. The light emitting display apparatus of claim 18, wherein the edge pattern layer has a thickness of 1.0 to 1.5 μm.

20. The light emitting display apparatus of claim 14, further comprising a color filter disposed between the planarization layer and the substrate overlapped with at least some of the plurality of pixel areas.

21. A light emitting display apparatus, comprising:
a substrate;
a display area having a plurality of pixel areas;
a non-display area surrounding the display area;
a pixel circuit portion at the display area;
a peripheral circuit portion at the non-display area;
a planarization layer at the pixel circuit portion and the peripheral circuit portion; and
a light emitting portion over the planarization layer of each of the plurality of pixel areas,
wherein the planarization layer at the peripheral circuit portion includes an uneven pattern portion,
wherein the uneven pattern portion includes a plurality of concave portions,
wherein the non-display area includes a pad area,
wherein the uneven pattern portion includes:
a first uneven pattern portion disposed at a first non-display area corresponding to a first side of the display area, the first non-display area including the pad area;
a second uneven pattern portion disposed at each of a second non-display area corresponding to a second side of the display area and a third non-display area corresponding to a third side of the display area, wherein the third side of the display area is parallel to the second side of the display area; and
a third uneven pattern portion disposed at a fourth non-display area corresponding to a fourth side of the display area, wherein the fourth side of the display area is parallel to the first side of the display area, and
wherein:
the number of concave portions per unit area of the first uneven pattern portion is larger than the number of concave portions per unit area of each of the second uneven pattern portion and the third uneven pattern portion; or a pitch between central points of two adjacent concave portions disposed at the first uneven pattern portion is smaller than a pitch between central points of two adjacent concave portions disposed at each of the second uneven pattern portion and the third uneven pattern portion.

22. The light emitting display apparatus of claim 21, wherein the number of concave portions per unit area of the third uneven pattern portion is larger than the number of concave portions per unit area of the second uneven pattern portion.

23. The light emitting display apparatus of claim 21, wherein the pitch between the central points of the two adjacent concave portions disposed at the third uneven pattern portion is smaller than the pitch between the central points of the two adjacent concave portions disposed at the second uneven pattern portion.

24. A light emitting display apparatus, comprising:
a substrate;
a display area with a plurality of pixel areas;
a non-display area surrounding the display area; and
a planarization layer disposed at the display area and partially at the non-display area,
wherein the planarization layer includes a plurality of concave portions,
wherein the non-display area includes a pad area, and the planarization layer is disposed at a remaining non-display area except the pad area of the non-display area,
wherein:
a number of concave portions per unit area of the planarization layer disposed at the display area is same as a number of concave portions per unit area of the planarization layer disposed at the remaining non-display area except the pad area of the non-display area; or
a pitch between central points of two adjacent concave portions of the planarization layer disposed at the display area is same as a pitch between central points of two adjacent concave portions of the planarization layer disposed at the remaining non-display area except the pad area of the non-display area.

25. The light emitting display apparatus of claim 24,
wherein the planarization layer is only partially disposed at the non-display area; and
wherein the planarization layer includes protruding portions disposed between the plurality of concave portions disposed at a surface or includes an undulated shape.

* * * * *